United States Patent
Pang et al.

(10) Patent No.: US 10,868,220 B2
(45) Date of Patent: Dec. 15, 2020

(54) MULTIPLE LED LIGHT SOURCE LENS DESIGN IN AN INTEGRATED PACKAGE

(71) Applicant: CREE HUIZHOU SOLID STATE LIGHTING COMPANY LTD., Guangdong (CN)

(72) Inventors: Chak Hau Charles Pang, Fanling (HK); Yue Kwong Victor Lau, Laguna (HK); JuZuo Sheng, Huizhou (CN); Christopher P. Hussell, Cary, NC (US)

(73) Assignee: Cree Huizhou Solid State Lighting Company Limited, Huizhou (CN)

( * ) Notice: Subject to any disclaimer, the term of this patent is extended or adjusted under 35 U.S.C. 154(b) by 0 days.

(21) Appl. No.: 15/570,258

(22) PCT Filed: Aug. 25, 2017

(86) PCT No.: PCT/CN2017/099084
§ 371 (c)(1),
(2) Date: Jul. 23, 2018

(87) PCT Pub. No.: WO2019/037094
PCT Pub. Date: Feb. 28, 2019

(65) Prior Publication Data
US 2020/0176643 A1 Jun. 4, 2020

(51) Int. Cl.
*H01L 33/48* (2010.01)
*H01L 33/58* (2010.01)
(Continued)

(52) U.S. Cl.
CPC ........ *H01L 33/486* (2013.01); *H01L 25/0753* (2013.01); *H01L 33/54* (2013.01);
(Continued)

(58) Field of Classification Search
CPC ... H01L 33/486; H01L 25/0753; H01L 33/60; H01L 33/62; H01L 33/58; H01L 33/54
(Continued)

(56) References Cited

U.S. PATENT DOCUMENTS

| | | | | |
|---|---|---|---|---|
| 2008/0012036 A1* | 1/2008 | Loh | ........................ | H01L 33/483 257/99 |
| 2009/0129073 A1* | 5/2009 | Yaw | .......................... | G09F 9/33 362/231 |

FOREIGN PATENT DOCUMENTS

CN    102569626    *  1/2012

* cited by examiner

*Primary Examiner* — Caleen O Sullivan
(74) *Attorney, Agent, or Firm* — Ferguson Case Orr Paterson LLP

(57) ABSTRACT

Light emitting diode (LED) packages and LED displays utilizing the LED packages are disclosed. LED packages can have a plurality of cavities with each having one or more LEDs. The LEDs can be individually controllable so that the LED package emits the desired color combination of light from the package. The LED packages are arranged with an encapsulant over the cavities that shape the LED package emission to a wide angle or pitch. Some of the LED packages can have three cavities, while others can have four or more cavities. The packages can comprise an encapsulant that forms lenses over the cavities and continues beyond the cavities to cover surfaces of the LED package body. The body can include different anchoring features to improve package reliability by anchoring the encapsulant to the body. One embodiment of an LED display according to the present invention comprises a plurality of LED packages, at least some having a plurality of cavities. Each of the packages comprises a lens over each cavity to produce an emission of the LEDs that has a wider angle compared to the emission without the lens. A potting material can be included between
(Continued)

adjacent ones of the LED packages and overlaps the package encapsulant to further improve reliability.

20 Claims, 27 Drawing Sheets

(51) Int. Cl.
    *H01L 33/60*     (2010.01)
    *H01L 33/62*     (2010.01)
    *H01L 33/54*     (2010.01)
    *H01L 25/075*     (2006.01)

(52) U.S. Cl.
    CPC .............. *H01L 33/58* (2013.01); *H01L 33/60* (2013.01); *H01L 33/62* (2013.01)

(58) Field of Classification Search
    USPC .......................................................... 257/88
    See application file for complete search history.

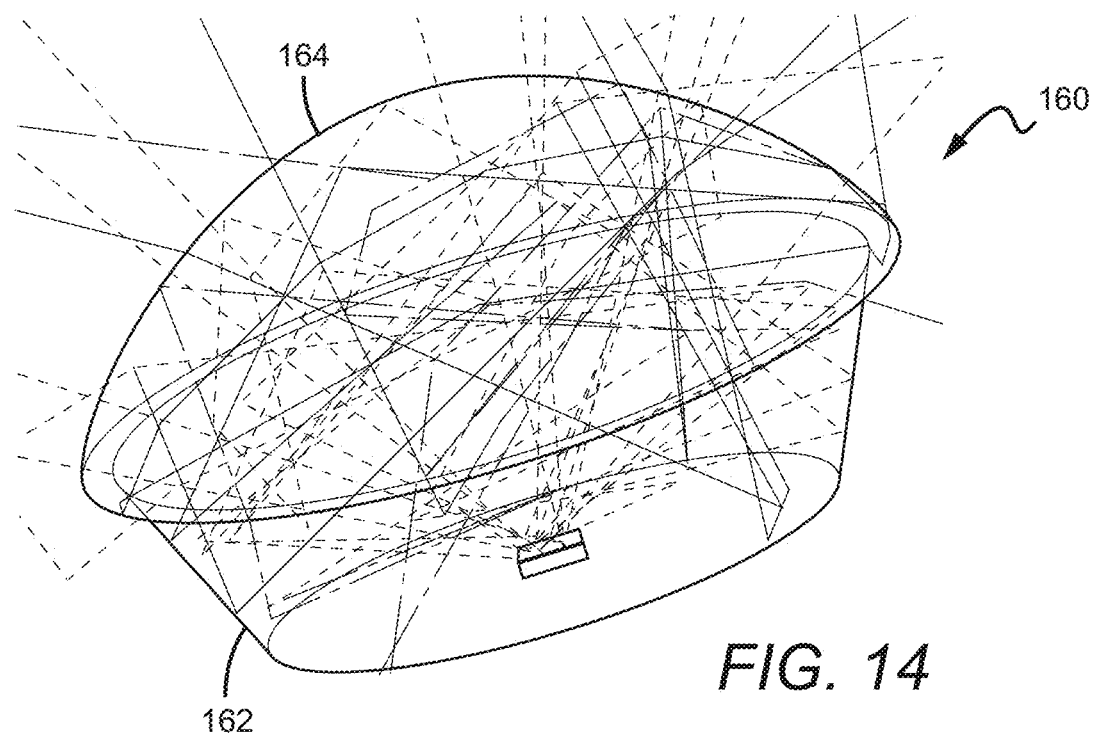
FIG. 14
FIG. 15
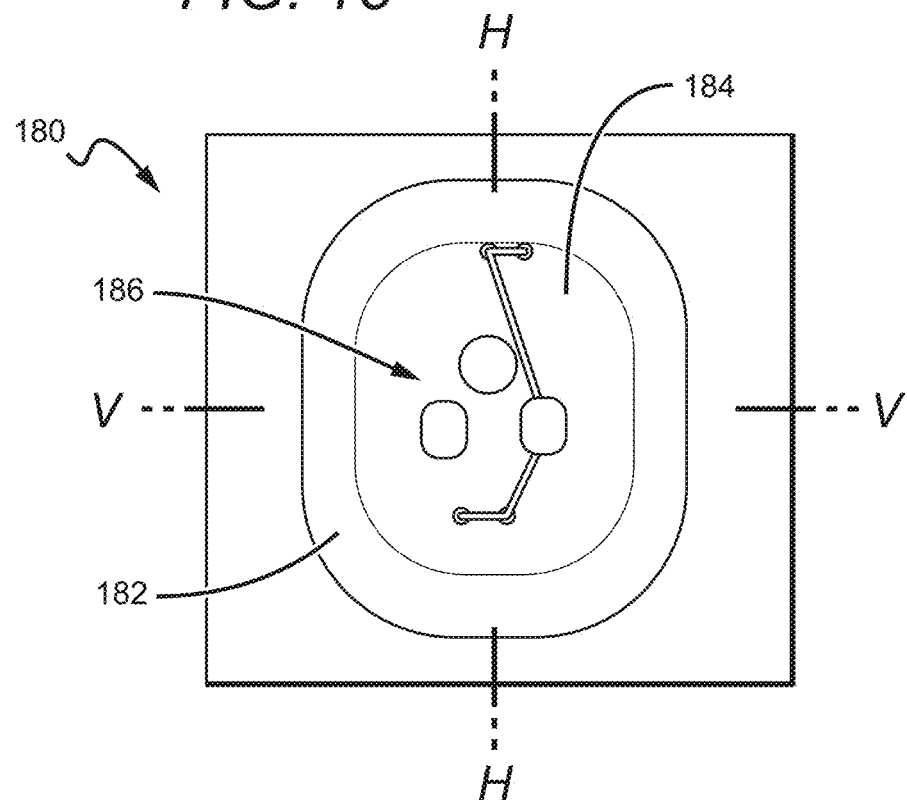

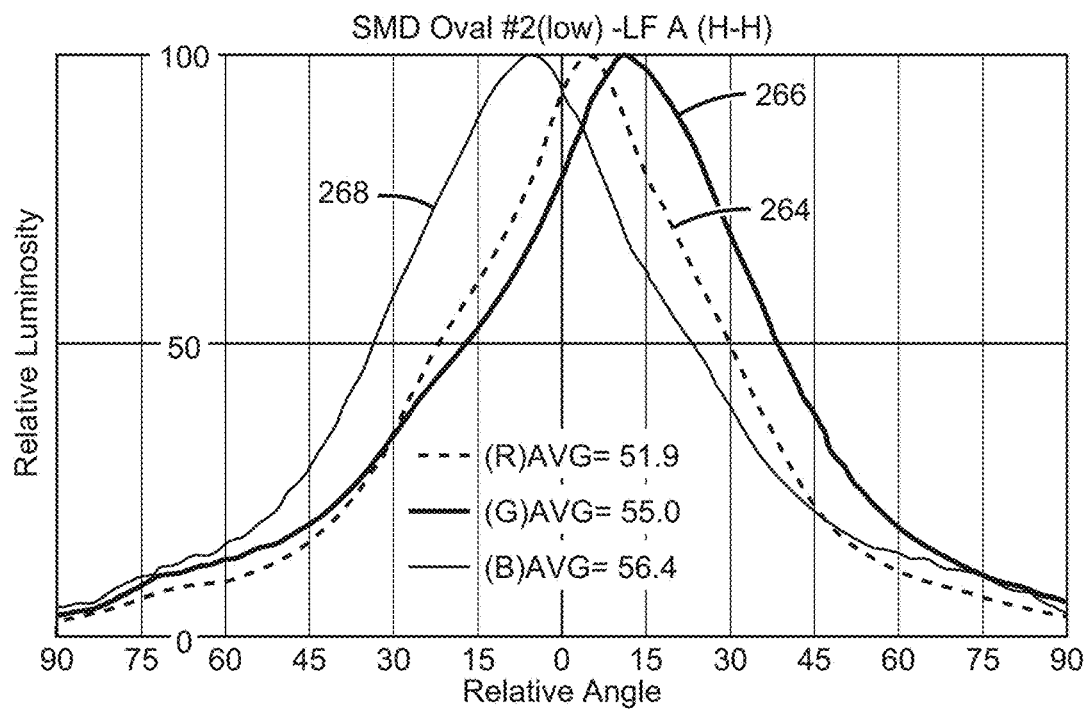
FIG. 22
FIG. 23
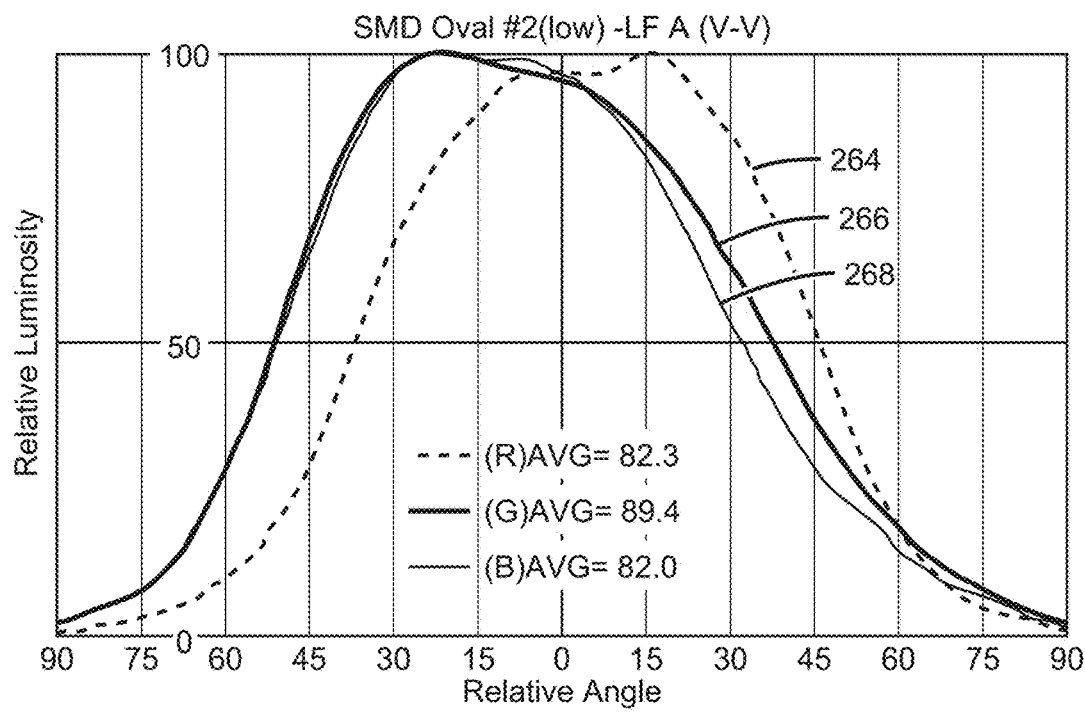

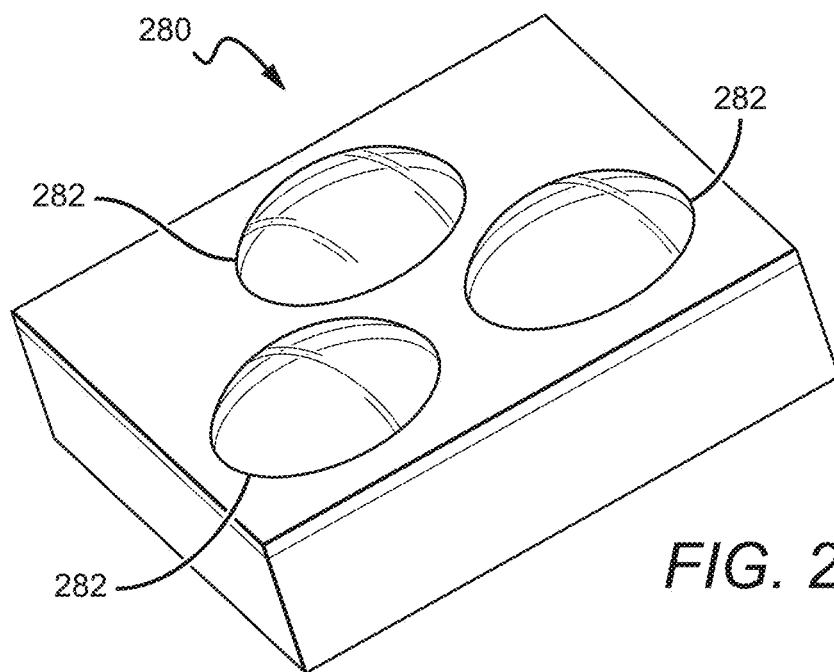
FIG. 24
FIG. 25
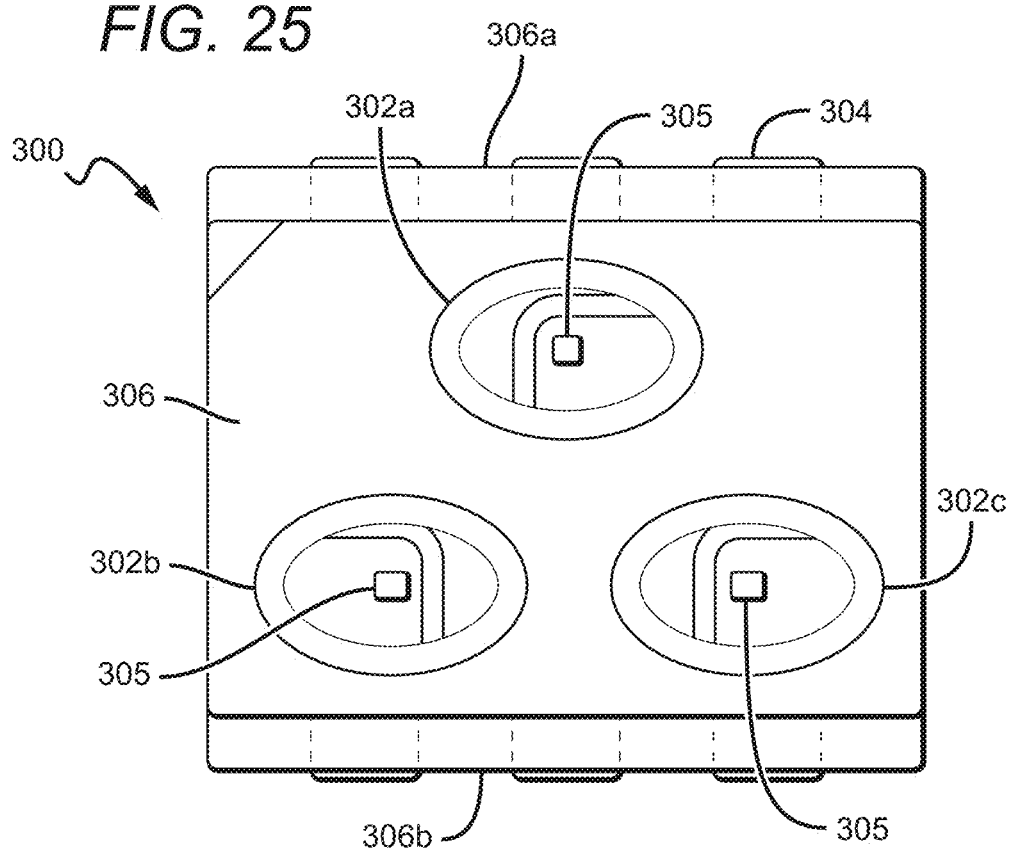

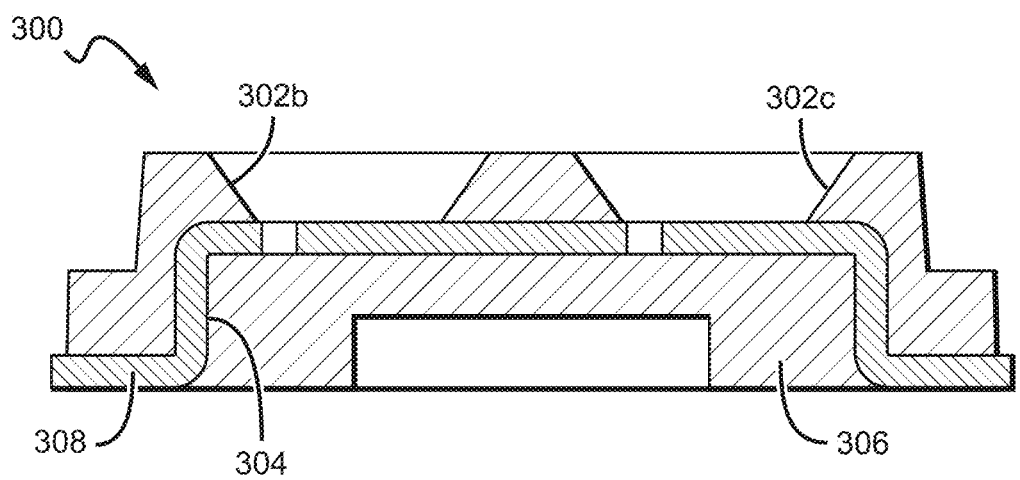
FIG. 26
FIG. 27
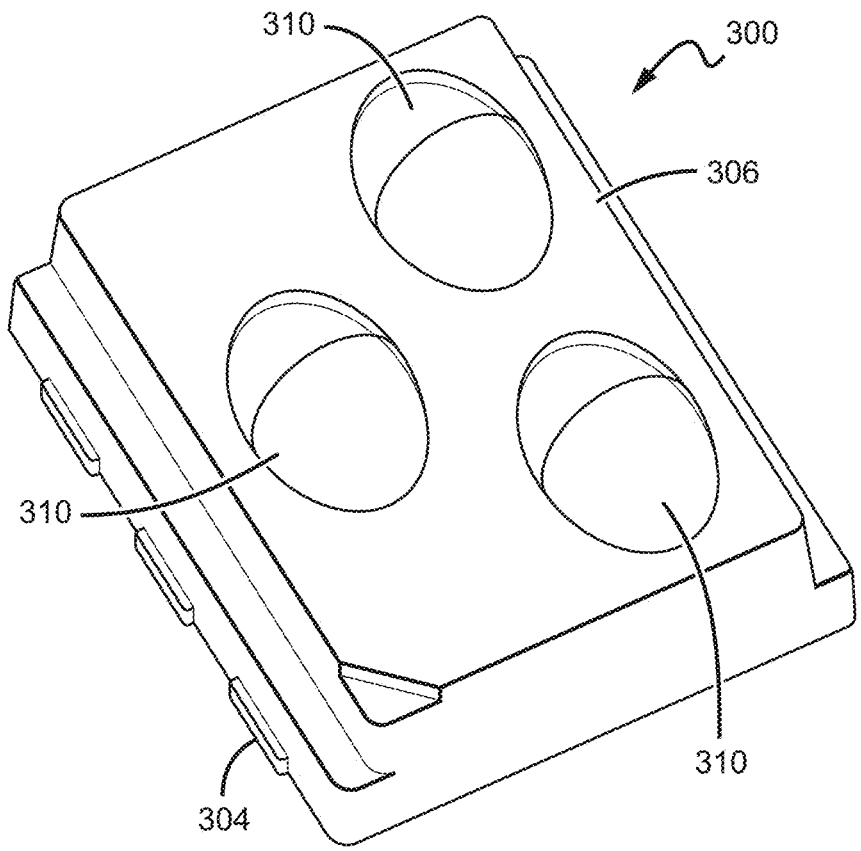

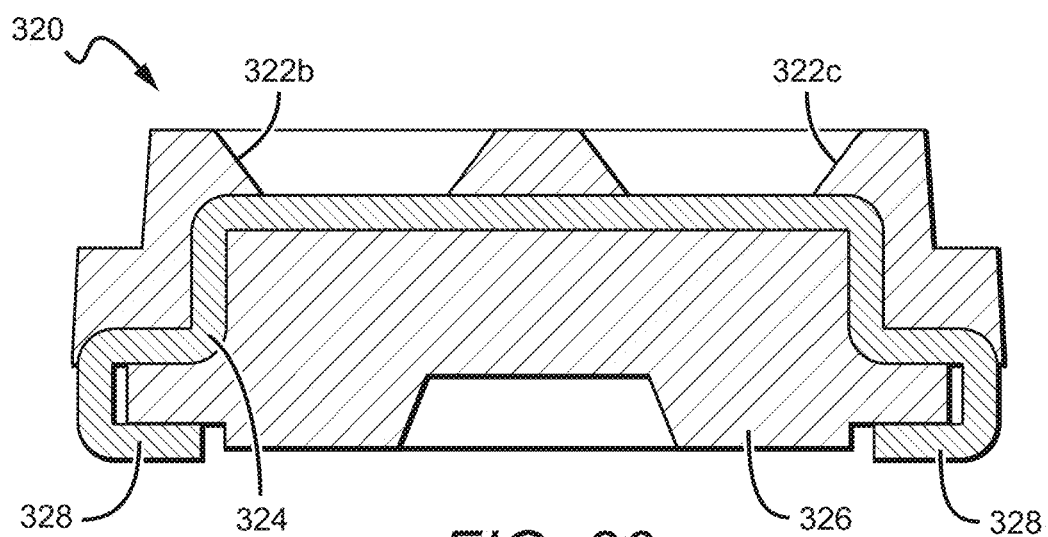
FIG. 30
FIG. 31
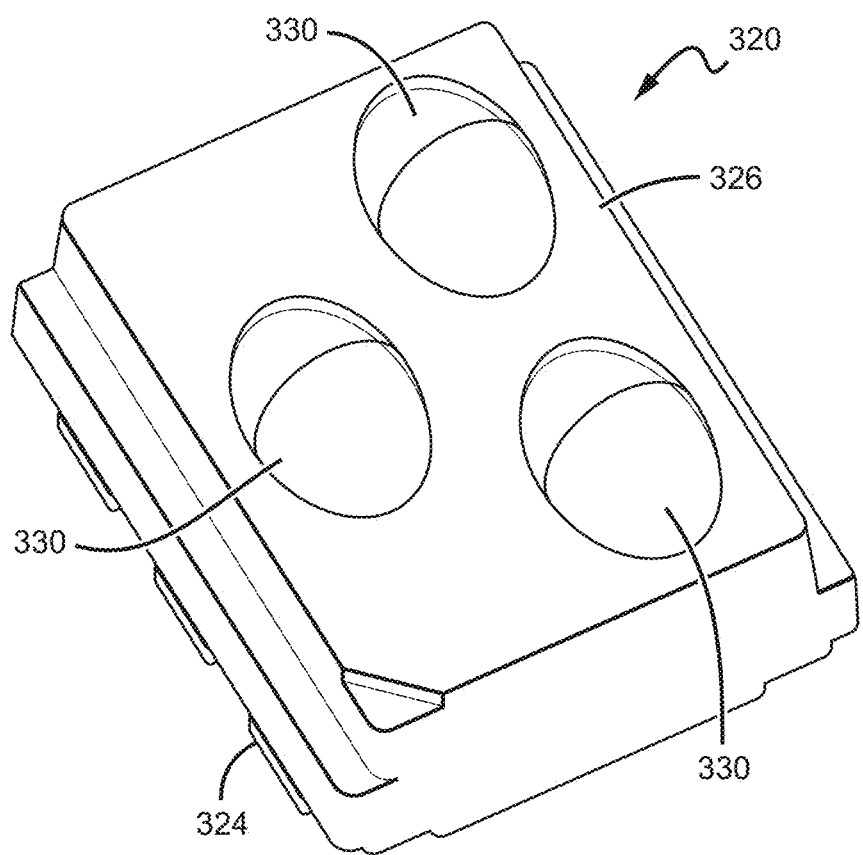

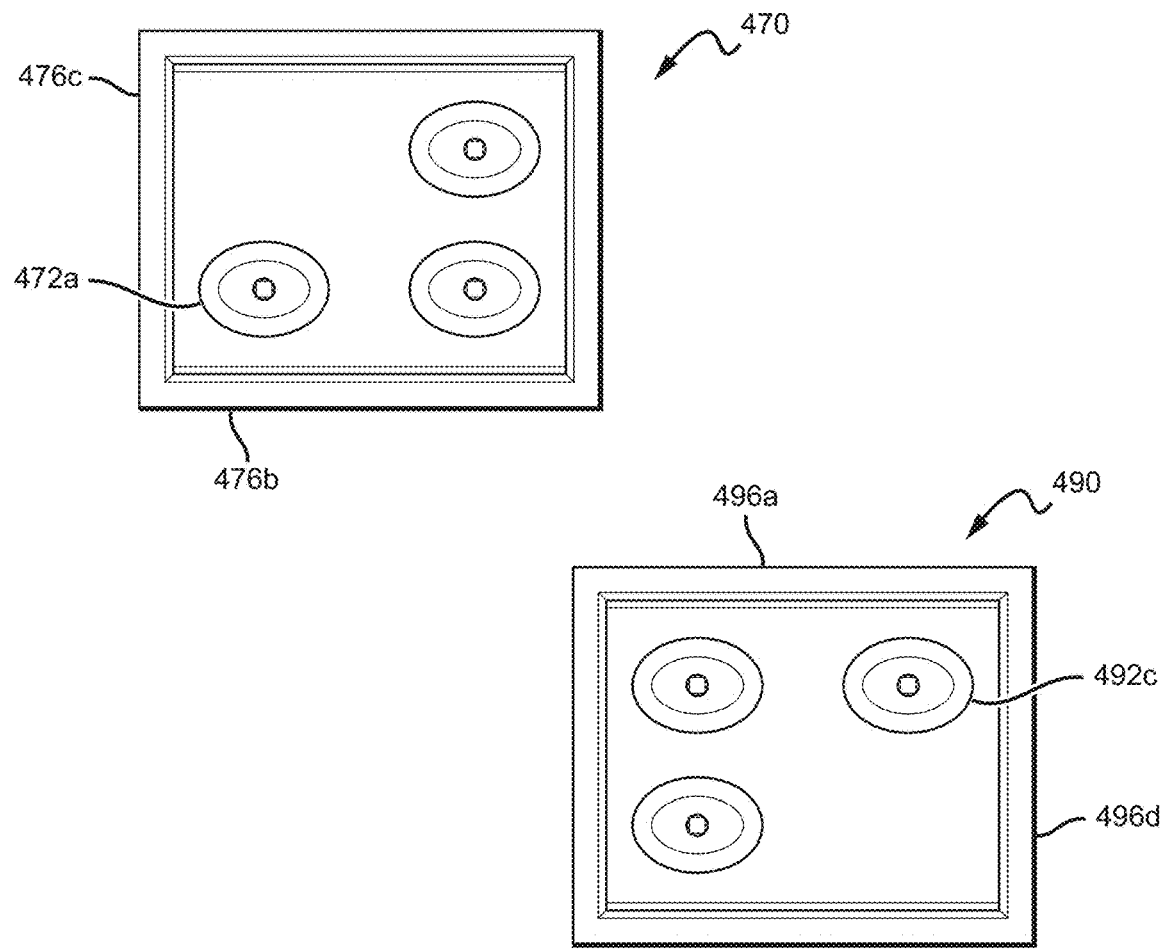
FIG. 39
FIG. 40
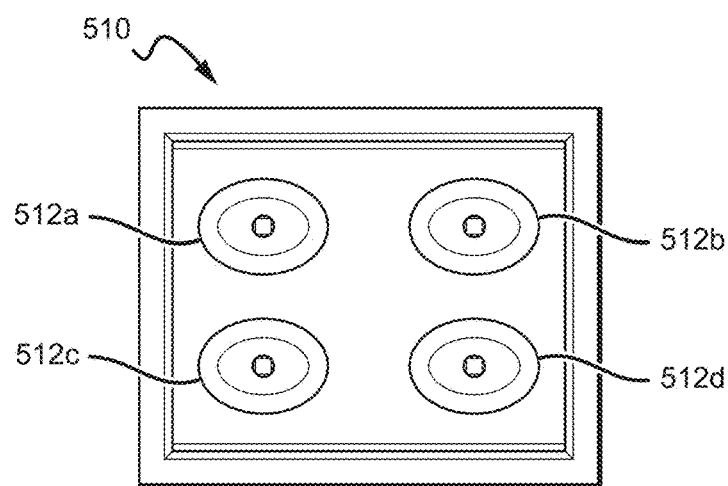
FIG. 41

MULTIPLE LED LIGHT SOURCE LENS DESIGN IN AN INTEGRATED PACKAGE

BACKGROUND OF THE INVENTION

Field of the Invention

This invention relates to light emitting diodes (LED or LEDs) and in particular LED packages and displays utilizing LED packages.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Technological advances over the last decade or more has resulted in LEDs having a smaller footprint, increased emitting efficiency, and reduced cost. LEDs also have an increased operation lifetime compared to other emitters. For example, the operational lifetime of an LED can be over 50,000 hours, while the operational lifetime of incandescent bulb is approximately 2,000 hours. LEDs can also be more robust than other light sources and can consume less power. For these and other reasons, LEDs are becoming more popular and are now being used in more and more applications that have traditionally been the realm of incandescent, fluorescent, halogen and other emitters.

LEDs are now being used in displays, both big and small. Large screen LED based displays (often referred to as giant screens) are becoming more common in many indoor and outdoor locations, such as at sporting events, race tracks, concerts and in large public areas such as Times Square in New York City. Many of these displays or screens can be as large as 60 feet tall and 60 feet wide, or larger. These screens can comprise thousands of "pixels" mounted on a flat surface to generate an image, with each pixel containing a plurality of LEDs. The pixels can use high efficiency and high brightness LEDs that allow the displays to be visible from relatively far away, even in the daytime when subject to sunlight. The pixels can have as few as three or four LEDs (one red, one green, and one blue) that allow the pixel to emit many different colors of light from combinations of red, green and/or blue light. In the largest giant screens, each pixel module can have more than three LEDs, with some having dozens of LEDs. The pixels can be arranged in a rectangular grid with the size and density of the screen determining the number of pixels. For example, a rectangular display can be 640 pixels wide and 480 pixels high, with the end size of the screen being dependent upon the actual size of the pixels.

Conventional LED based displays are controlled by a computer system that accepts an incoming signal (e.g. TV signal) and based on the particular color needed at the pixel module to form the overall display image, the computer system determines which LED in each of the pixel modules is to emit light and how brightly. A power system can also be included that provides power to each of the pixel modules and the power to each of the LEDs can be modulated so that it emits at the desired brightness. Conductors are provided to apply the appropriate power signal to each of the LEDs in the pixel modules.

Some large LED displays are arranged for wide angle or wide pitch emission that allows for a wide lateral range of viewing angles. Pixels for conventional wide-angle displays can use oval lamp LEDs, with some using 3 lamps for each pixel. FIG. 1 shows one embodiment of conventional red, green and blue LEDs 12, 14 and 16 that can be used to form a pixel in a display, and FIG. 2 shows a conventional pixel 10 that includes the red, green and blue LEDs 12, 14, 16 that are mounted to a substrate 18 using conventional through-hole techniques. Each of the LED lamps 12, 14, 16 has an oval shaped lens to produce a wider-angle emission pattern compared to lamps with a circular lens. Fabricating giant screens with three or more separate LED lamps per pixel can be costly and complicated.

FIG. 3 shows the red LED lamp emission pattern 20, the green LED lamp emission pattern 22 and the blue LED lamp emission pattern 24 from the LEDs 12 14, 16. The spacing of the LED lamps 12, 14, 16 as shown in FIG. 2 can result in each of the emission patterns offset from the pixel center point 26. This offset can inhibit pixel color mixing, particularly in the far field. FIG. 4 is a graph 30 showing one example of the emission pattern for a conventional pixel showing the emissions from red LED 32, the green LED 34 and the blue LED 36. The emissions do not fully overlap, which can result in less than optimal color mixing in the far field.

SUMMARY OF THE INVENTION

The present invention is directed to LED packages and LED displays utilizing the LED packages, with some embodiments comprising high-density LED displays. The present invention is particularly applicable to LED packages having one or more cavities with one or more LEDs arranged in each of the cavities, the emission of the LEDs is controlled so that each of the packages emits a desired color combination of light from the LEDs. The LED packages are arranged with an encapsulant or lens over the cavities to that help shape the LED package emission to a wide angle or pitch. The LED packages can also be arranged in different ways to improve reliability. In some embodiments, the encapsulant can spread beyond to lenses to cover surfaces of the LED package's body. The LED package's body can also comprise different anchoring features to improve anchoring between the body and the encapsulant and to minimize moisture intrusion.

One embodiment of an LED package according to the present invention comprises a body having body side surfaces and a body top surface. A plurality of cavities are included in the top surface, with each of the cavities having an LED arranged to emit out of its one of the cavities. An encapsulant is included over the body top surface and the body side surfaces, with the encapsulant also comprising lenses over each of the cavities to shape the emission of the LEDs to the desired emission profile. The intensity of each of the LEDs is individually controllable so that the LED package can emit different color combinations of light from the LEDs.

Another embodiment of an LED package according to the present invention comprises a body having side surfaces and a top surface. A plurality of cavities is included in the top surface, with each of the cavities having an LED arranged to emit out of its one of the cavities. A plurality of anchoring features are included in the surface of the body. An encapsulant is included over the body top surface and the body side surfaces, with the encapsulant cooperating with the anchoring features to anchor the encapsulant to the body.

One embodiment of an LED display according to the present invention comprises a plurality of LED packages with at least some comprising a body with a plurality of cavities. Each of the cavities can have an LED arranged to emit out of its one of the cavities. An encapsulant can be included over the cavities and continuing down the side surfaces of the body, with the encapsulant also forming lenses over each of the cavities. A potting material can be included between adjacent ones of the LED packages, with the potting material having a thickness such that it overlaps the encapsulant on the body side surfaces.

These and other aspects and advantages of the invention will become apparent from the following detailed description and the accompanying drawings, which illustrate by way of example the features of the invention.

BRIEF DESCRIPTION OF THE DRAWINGS

FIG. 14 is a perspective view of another embodiment of an LED package lens according to the present invention;

FIG. 15 is a perspective view of another embodiment of an LED package according to the present invention;

FIG. 22 is a graph showing emission patterns for one LED package according to the present invention taken along one axis;

FIG. 23 is another graph for the same LED package shown in FIG. 22, taken along an orthogonal axis;

FIG. 24 is a perspective view of another LED package according to the present invention FIG. 25 is a top view of another embodiment of an LED package according to the present invention;

FIG. 26 is a side view of the LED package shown in FIG. 25;

FIG. 27 is a top perspective view of the LED package shown in FIG. 25, with lenses in the cavities;

FIG. 30 is a side view of the LED package shown in FIG. 29;

FIG. 31 is a top perspective view of the LED package shown in FIG. 29, with lenses in the cavities;

FIG. 39 is a top view of another embodiment of an LED package according to the present invention;

FIG. 40 is a top view of another embodiment of an LED package according to the present invention;

FIG. 41 is a top view of another embodiment of an LED package according to the present invention;

DETAILED DESCRIPTION OF THE INVENTION

Figure 1:
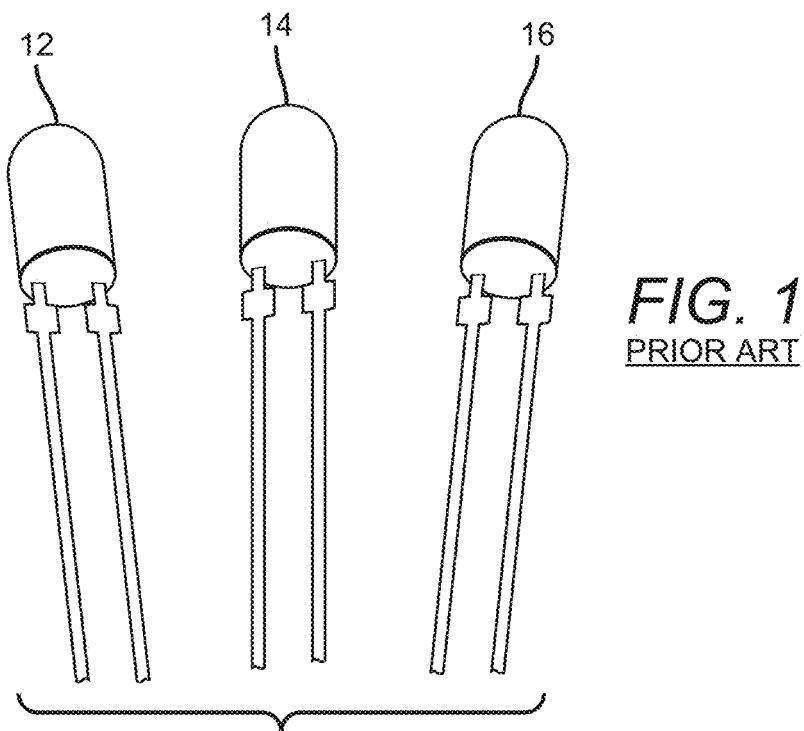
FIG. 1 is a side view of conventional light emitting diodes (LEDs) that can be used for pixels in a display.
Figure 2:
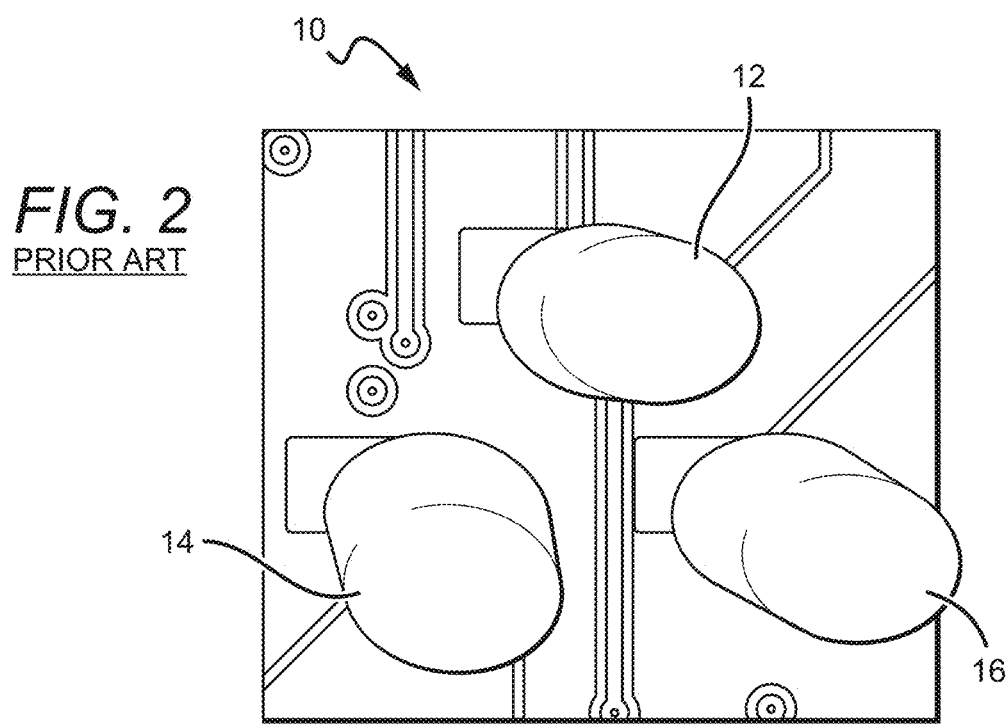
FIG. 2 is a perspective view of the LEDs in FIG. 1 mounted in a display as one pixel.
Figure 3:
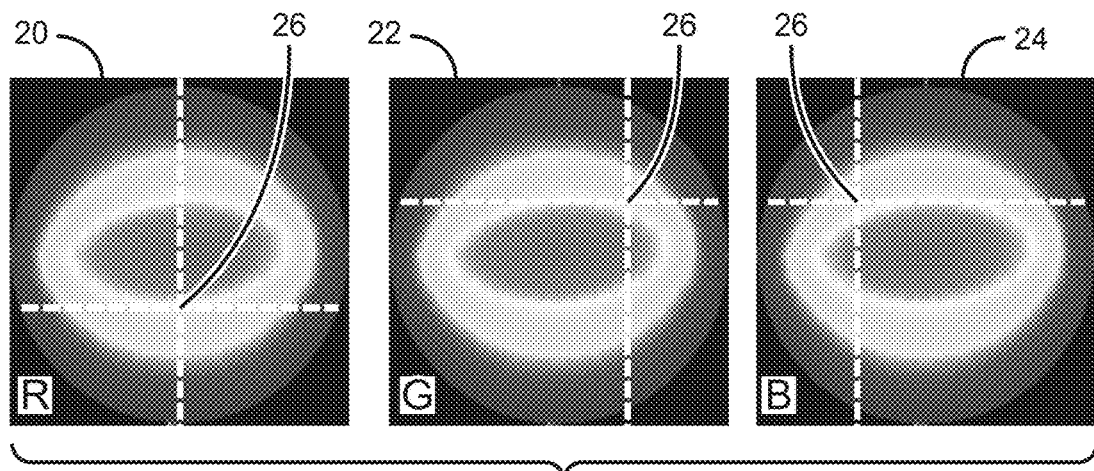
FIG. 3 shows the individual emission patterns for the LEDs in FIG. 2.
Figure 4:
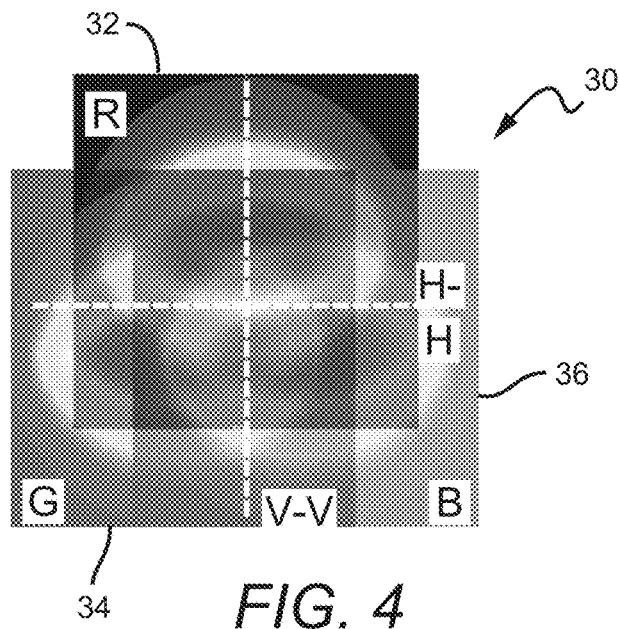
FIG. 4 shows the overlap of the emissions for the LEDs in the pixel in FIG. 2.

The present invention is directed to various embodiments of surface mount device (SMD) light emitting diode packages and displays using those packages. Each of the packages is arranged to be used for a single pixel, instead of the conventional LED displays that can use multiple LED or LED lamps per pixel. This can make manufacturing of the display easier and less expensive, can provide for display that is more reliable, and in some instances, can result in higher density display.

In some embodiments, the LED packages according to the present invention can have a single oval shaped cavity or can have multiple oval shaped cavities. The cavities can have an oval shaped lens which can help shape the emission of the package to provide wide angle or wide pitch emission along an axis or centerline of the LED package compared to an LED package with circular cavity and hemispheric lens. This allows for displays using the LED packages to provide for a wider emission angle or pitch.

In some embodiments, the LED packages can have a plurality of LEDs mounted at or near the base of the cavity of a single, with the LEDs being relatively close to one another. This allows for the LEDs to approximate a point light source, which can result in improved color mixing particularly in the far field. This LED packages allows for good color mixing while still providing wide angle emission. In other embodiments, the LED packages can have a plurality of cavities, each having an LED that emits a different color of light. The LED package can emit light that is a combination of light from the different cavities, with the cavities approximating a light source.

In addition to the above advantages, the LED packages according to the present invention can be easier to handle compared to conventional LEDs, and can be easier to assemble into an LED display. The LED packages and resulting LED displays can provide improved emission while at the same time being more reliable and having longer life span.

The different embodiments according to the present invention can comprise different shapes and sizes of cavities, with some cavities having a curved surface while others can have an angled side surface and planar base. Solid state emitters are included at or near the center of the emitter base, with some embodiments having emitters that comprise light emitting diodes that emit the same or different colors of light. In some embodiments, the LEDs can comprise red, green and blue emitting LEDs that are individually controllable. The packages can emit different colors combinations of light from the LEDs depending on the intensity of each the respective LEDs. The LEDs are arranged in close proximity to one another to approximate a point light source. This can enhance color mixing and can improve the packages emission FFP.

The different LED package embodiments can comprise different features to enhance operational reliability. Some LED packages can have a body with anchoring features arranged to cooperate with the encapsulant material to help anchor the encapsulant to the body. This can improve reliability by holding the encapsulant to the body and by resisting moisture intrusion. Other embodiments can comprise an encapsulant that extends beyond the cavities to cover the surfaces of the LED package's body. This additional encapsulant coverage also increases reliability by improving adhesion of the encapsulant to the body and by resisting moisture intrusion. In LED displays, a potting material can be included between adjacent LED packages, with the potting material overlapping with the encapsulant to improve overall reliability as described below.

The present invention is described herein with reference to certain embodiments, but it is understood that the invention can be embodied in many different forms and should not be construed as limited to the embodiments set forth herein. In particular, many different LED reflective cup and lead frame arrangements can be provided beyond those described herein, and the encapsulant can provide further features to alter the direction of emissions from the LED packages and LED displays utilizing the LED packages. Although the different embodiments of LED packages discussed below are directed to use in LED displays, they can be used in many other applications either individually or with other LED packages having the same or different peak emission tilt.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 5:
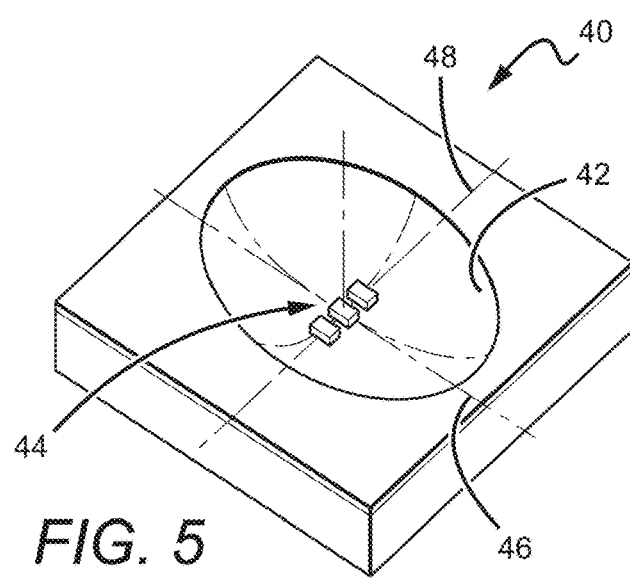
FIG. 5 is a perspective view of one embodiment of an LED package according to the present invention.

FIG. 5 shows one embodiment of an LED package 40 according to the present invention having an oval shaped cavity or reflective cup ("cavity) 42 with a plurality of emitters 44 at the base of the cavity 42. It is understood that most or all of the pixel modules in an LED display can comprise essentially the same or similar LED packages, and one embodiment of a display according to the present invention can comprise LED packages that are the same as or similar to the LED package 40. Each of the LED packages can be capable of emitting many different colors with the same or similar FFP, with the plurality of LED packages emitting light that combines to form the image projected by the display.

The emitters 44 can comprise a plurality of LEDs mounted at the base of the cavity 42 using known mounting methods. The cavity 42 can have many different shapes and sizes as described in more detail below, with the cavity 42 in the embodiment shown being oval shaped and having a curved surface to reflect side emitted light from the LED 42 in a direction to contribute to the desired emission from the LED package 40. All or some of the surfaces of the cavity are covered by a reflective material that also causes diffusion of the light, which helps in light mixing. In some embodiments, the surfaces can be covered by a flat white paint that is at least 90% reflective and is also diffusive.

Lead frames and/or wire bonds are included for applying an electrical signal to the emitters, and lens (not shown) can be formed in and over the cavity 42. In some embodiments, the lead frame and wire bonds can be provided on a printed circuit board (PCB) with the cavity formed (such as by molding processes) on the PCB. The PCB can serve as the bottom surface of the cavity. In other embodiments, such as PLCC packages, the housing and cavity are formed (such as by molding processes) around a lead frame, with the lead frame being accessible at the base of the cavity. In some embodiments, the lead frame can comprise a reflective material to reflect light emitted toward the lead frame so that the light can contribute to overall emission of the LED package.

In some embodiments, the lens can comprise a transparent material, such as an epoxy, that protects the LED, cavity and any electrical connections, and can shape the light emitting from the package 40. In other embodiments, the lens can comprise light conversion materials (such as phosphors), light scattering particles to mix the package light, and texturing to enhance light extraction. The lens can comprise many different shapes and sizes. In some embodiments, the lens can be dome shaped, while in other embodiments the lens can be oval shaped to match the shape of the cavity 42. Still in other embodiments, the lens can comprise a hybrid of different shapes, with one embodiment comprises in integration of 3 oval shapes with each of the ovals arranged to primarily enhance or shape light extraction from a respective one of the emitters 44.

The emitters 44 can comprise different types and different numbers of solid state emitters and the emitters can emit the same of different colors of light. In the embodiment shown package 40 comprises three solid state emitters with the first emitting red light, the second emitting green light and the third emitting blue light. The respective emitters in some embodiments can emit light of approximately 470 nm, 527 nm and 619 nm wavelength. The LEDs can have many different sizes and can emit many different emission patterns, with the preferred LED emitting a generally Lambertian emission pattern.

Each of the emitters can be individually controlled to emit different intensities, with the emissions from the emitters combining to emit different colors in the emission spectrum. It is understood that the emitters 44 can comprise more or less than three emitters, with some embodiments having 4, 8, 12 or more emitters. In the embodiment shown, the emitters 44 comprise three light emitting diodes (LEDs).

Fabrication of conventional LEDs is generally known, and is only briefly discussed herein. LEDS can be fabricated using known processes with a suitable process being fabrication using metal organic chemical vapor deposition (MOCVD). The layers of the LEDs generally comprise an active layer/region sandwiched between first and second oppositely doped epitaxial layers all of which are formed successively on a growth substrate. LEDs can be formed on a wafer and then singulated for mounting in a package. It is understood that the growth substrate can remain as part of the final singulated LED or the growth substrate can be fully or partially removed.

It is also understood that additional layers and elements can also be included in LEDs 48, including but not limited to buffer, nucleation, contact and current spreading layers as well as light extraction layers and elements. The active region can comprise single quantum well (SQW), multiple quantum well (MQW), double heterostructure or super lattice structures. The active region and doped layers may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a preferred embodiment, the doped layers are gallium nitride (GaN) and the active region is InGaN. In alternative embodiments, the doped layers may be AlGaN, aluminum gallium arsenide (AlGaAs) or aluminum gallium indium arsenide phosphide (AlGaInAsP).

The growth substrate can be made of many materials such as sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in U.S. Pat. Nos. Re. 34,861; 4,946,547; and 5,200,022.

LEDs can also comprise a conductive current spreading structure and wire bond pads on the top surface, both of which are made of a conductive material that can be deposited using known methods. Some materials that can be used for these elements include Au, Cu, Ni, In, Al, Ag or combinations thereof and conducting oxides and transparent conducting oxides. The current spreading structure can comprise conductive fingers arranged in a grid on LEDs 48 with the fingers spaced to enhance current spreading from the pads into the LED's top surface. In operation, an electrical signal is applied to the pads through a wire bond as described below, and the electrical signal spreads through the fingers of the current spreading structure and the top surface into the LEDs. Current spreading structures are often used in LEDs where the top surface is p-type, but can also be used for n-type materials.

Some or all of the LEDs described herein can be coated with one or more phosphors with the phosphors absorbing at least some of the LED light and emitting a different wavelength of light such that the LED emits a combination of light from the LED and the phosphor. In one embodiment, according to the present invention the white emitting LEDs have an LED that emits light in the blue wavelength spectrum and the phosphor absorbs some of the blue light and re-emits yellow. The LEDs emit a white light combination of blue and yellow light. In other embodiments, the LED chips emit a non-white light combination of blue and yellow light as described in U.S. Pat. No. 7,213,940. In some embodiments, the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include: $Tb_{3-x}RE_xO_{12}$:Ce(TAG); RE=Y, Gd, La, Lu; or $Sr_{2-x-y}Ba_x Ca_ySiO_4$:Eu.

LEDs that emit red light can comprise LED structures and materials that permit emission of red light directly from the active region. Alternatively, in other embodiments the red emitting LEDs can comprise LEDs covered by a phosphor that absorbs the LED light and emits a red light. Some phosphors appropriate for this structure can comprise: $Lu_2O_3$:Eu$^{3+}$; $(Sr_{2-x}La_x)(Ce_{1-x}Eu_x)O_4$; $Sr_{2-x}Eu_xCeO_4$; $SrTiO_3$:Pr$^{3+}$,Ga$^{3+}$; $CaAlSiN_3$:Eu$^{2+}$; and $Sr_2Si_5N_8$:Eu$^{2+}$.

LEDs that are coated can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

The submounts or substrates described herein can be formed of many different materials with a preferred material being electrically insulating, such as a dielectric element, with the submount being between the LED array and the component backside. The submount can comprise a ceramic such as alumina, aluminum nitride, silicon carbide, or a polymeric material such as polymide and polyester etc. In one embodiment, the dielectric material has a high thermal conductivity such as with aluminum nitride and silicon carbide. In other embodiments the submounts can comprise highly reflective material, such as reflective ceramic or metal layers like silver, to enhance light extraction from the component. In other embodiments, the submount 42 can comprise a printed circuit board (PCB), alumina, sapphire or silicon or any other suitable material, such as T-Clad thermal clad insulated substrate material, available from The Bergquist Company of Chanhassen, Minn. For PCB embodiments, different PCB types can be used such as standard FR-4 PCB, metal core PCB, or any other type of printed circuit board.

Referring again to FIG. 5 LED packages according to the present invention can be many different shapes and sizes, with some of the packages having sizes that conform to the currently recognized package sizes. For example, the LED packages can comprise surface mount devices and can have sizes that conform to certain recognized surface mount device (SMD) sizes such as 3528SMD, 5050SMD, 3014SMD, 3020SMD, 2835SMD, etc. The LED packages can comprise plastic lead chip carrier package (PLCC), with some embodiments being sized to conform recognized PLCC sizes. It is understood, however, that the package sizes may also be those that do not comply with recognized sizes. The cavity can have many different sizes and in some embodiments, the cavity can be 6 mm or less across its widest portion. In other embodiments, it can be 4 mm or less across its widest portion, while in other embodiments is can be 3 mm or less across its widest portion.

The LED package 40 can also have emitters 44 arranged in different patterns at the base of cavity 42, with the embodiment shown having the emitters aligned in a row. The oval cavity 42 has a longitudinal axis 46 aligned with the wider portion of the cavity 42 and an orthogonal axis 48 aligned with narrower portion of the cavity 42, with the two-axis crossing at the base of the cavity. In the embodiment shown the emitters are aligned on the orthogonal axis 48 and the base of the cavity 42 where the axes cross. In other embodiments, the emitters can be aligned on the longitudinal axis 40 or they can be arranged in shapes around the crossing point, such as in a triangle, square shape around the crossing point. It is also understood that the emitters can be in other locations in the cavity, such as closer to an end or one of the sides.

In some embodiments, the LEDs can be arranged in relatively close proximity to one another to more closely approximate a point source. This can improve mixing of the light as well as the emitters overall FFP. In some embodiments, the emitters can be spaced approximately 500 microns or less apart. It is understood, that in other embodiments the emitters can be closer than 500 microns and in other embodiments they can be further apart. In some embodiments, the spacing between the LEDs is one quarter (¼) or less of the distance across the widest portion of the cavity. In other embodiments, the spacing between the LEDs is one eight (⅛) or less of the distance across the widest portion of the cavity. In still other embodiments, the spacing between the LEDs is one tenth (¹/₁₀) or less of the distance across the widest portion of the cavity.

Figure 6:
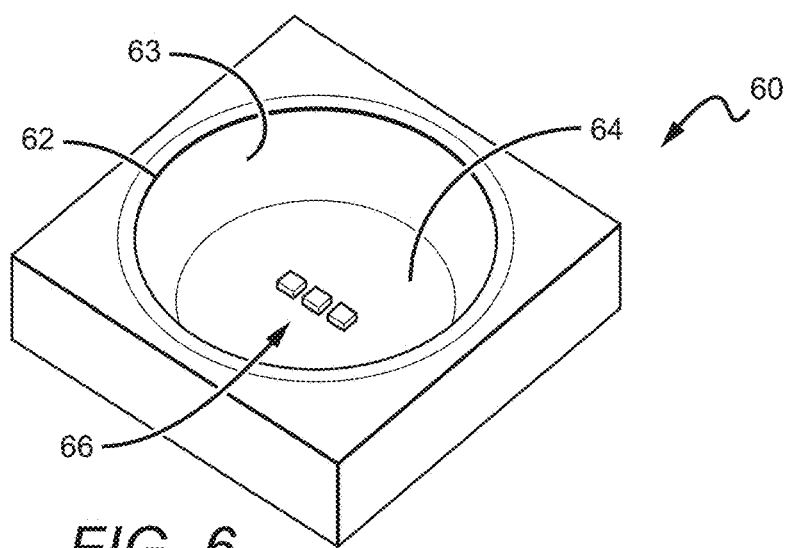
FIG. 6 is a perspective view of another embodiment of an LED package according to the present invention.
Figure 7:
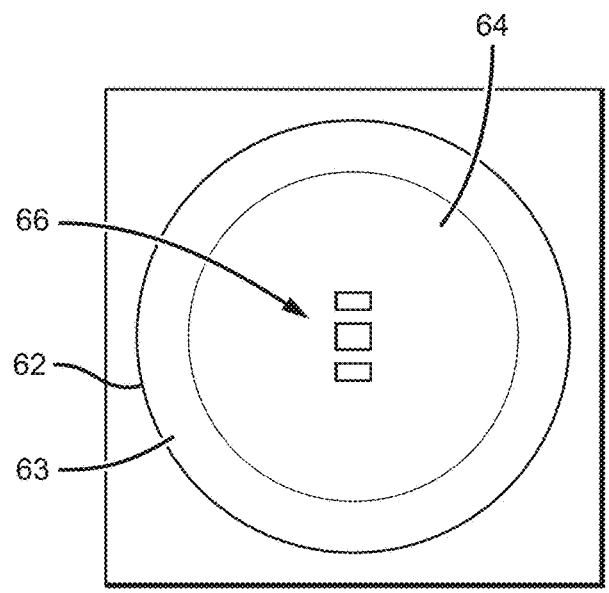
FIG. 7 is a top view of the LED package in FIG. 6.

It is understood that different emitter packages according to the present invention can have cavities with different shapes and sizes. In some embodiments, the cavity can have any generally circular shape and in other embodiments the cavity can have a planar base. FIGS. 6 and 7 show another embodiment of an LED package 60 according to the present invention having a circular cavity 62 with an angled side surface 63 and a planar base 64. The package 60 further comprises emitters 66 that can be mounted at or near the center of the base 64, with the emitters 64 arranged linearly on the base. The emitters comprise red, green and blue emitting LEDs, but it is understood that the emitters can comprise any of the numbers and types of emitters described above. Light from the LEDs can reflect off the base 64 and side surface 63 of the cavity to contribute to overall LED package emission.

The package 60 can also comprise an oval shaped lens (not shown) to shape the light from the emitters in wide angle or pitch. The high point or dome of the lens can be aligned with the any of the edges of the package 60 or can be arranged off alignment, such as diagonal. The cavity 62 can have many different sizes, with one embodiment having cavity depth of approximately 1.1 mm, and top radius of approximate 2.1 mm and base radius of approximately 1.6 mm.

Figure 8:
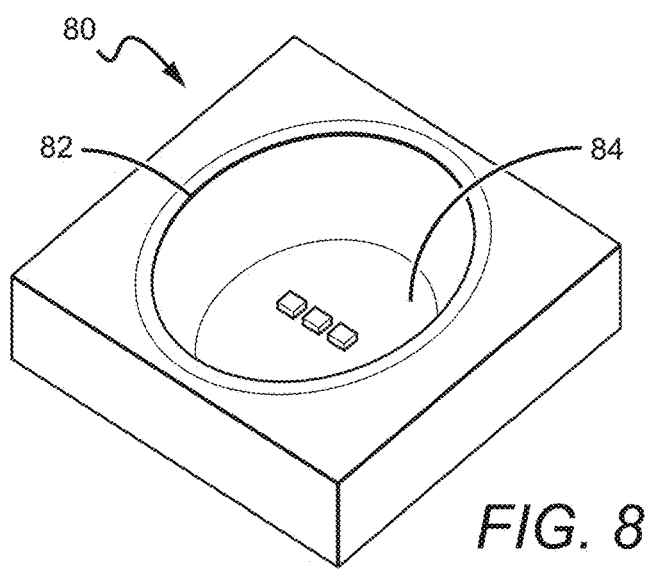
FIG. 8 is a perspective view of another embodiment of an LED package according to the present invention.
Figure 9:
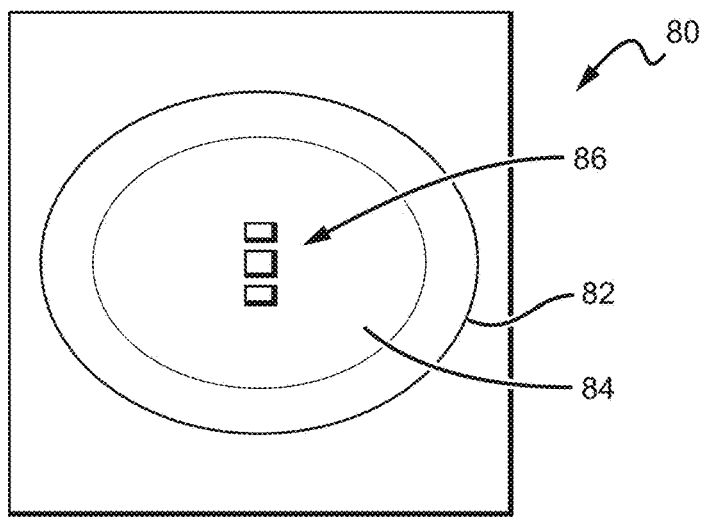
FIG. 9 is a top view of the LED package in FIG. 8.

FIGS. 8 and 9 show another embodiment of an LED package 80 according to the present invention having an oval cavity 82 with a planar oval base 84. Emitters 86 are mounted at or near the crossing point for the two axes of the cavity 82 as described above and shown in FIG. 5. The emitters 86 can comprise red, green and blue emitting LEDs, but it is understood that the emitters can comprise any of the numbers and types of emitters described above. The cavity can have many different oval shapes and sizes, with one embodiment having a depth of approximately 1.2 mm and oval shape having a radius at its narrow portion of approximately 2.1 mm and a radius at its widest portion of approximately 1.7 mm. The base can have a radius of approximately 1.6 mm at its narrow portion and a radius of 1.6 mm at its widest portion. It is understood that these dimensions are only exemplary and the cavity can have many different dimensions.

Figure 10:
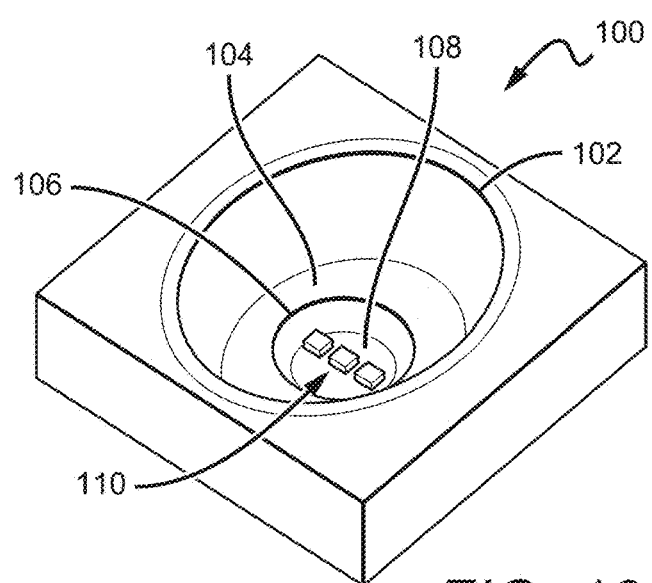
FIG. 10 is a perspective view of another embodiment of an LED package according to the present invention.
Figure 11:
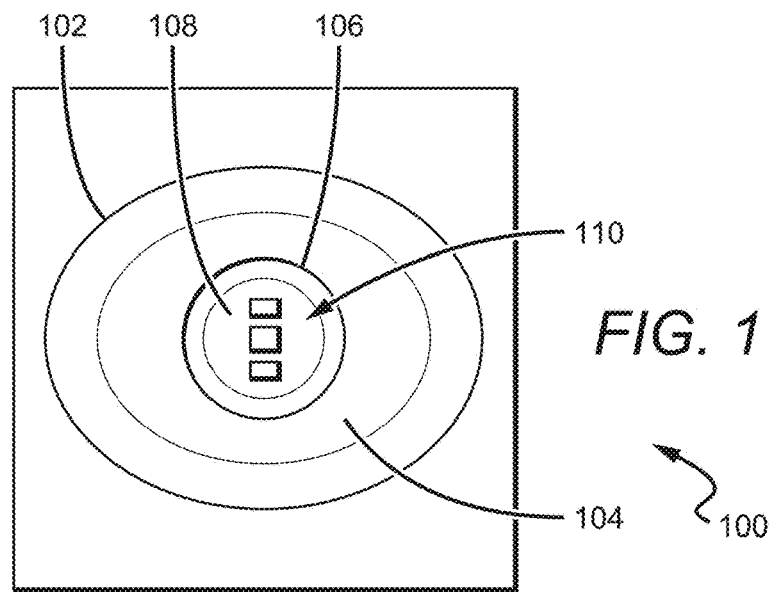
FIG. 11 is a top view of the LED package in FIG. 10.

FIGS. 10 and 11 show another embodiment of LED package 100 according to the present invention having a double cavity arrangement. The LED comprises a larger oval shaped first cavity 102 with planar base 104. The LED package 100 further comprises a smaller second cavity 106 arranged in the first cavity base 104. The second cavity 106 also has a planar base 108, with emitters 110 mounted on the planar base 108. It is understood, that in other embodiments the second cavity can have a curved bottom surface instead of a planar base. The emitters can comprise any of the emitters described above that can be spaced and arranged as described above. The LED package 100 can comprise an oval lens as described herein to shape the package's emission pattern. The LED package can also be arranged with different combination of shapes for both its first and second cavities, such as oval shaped first cavity with oval shaped second cavity, circular shaped first cavity with oval shaped second cavity, and circular shaped first cavity with circular shaped second cavity.

Figure 12:
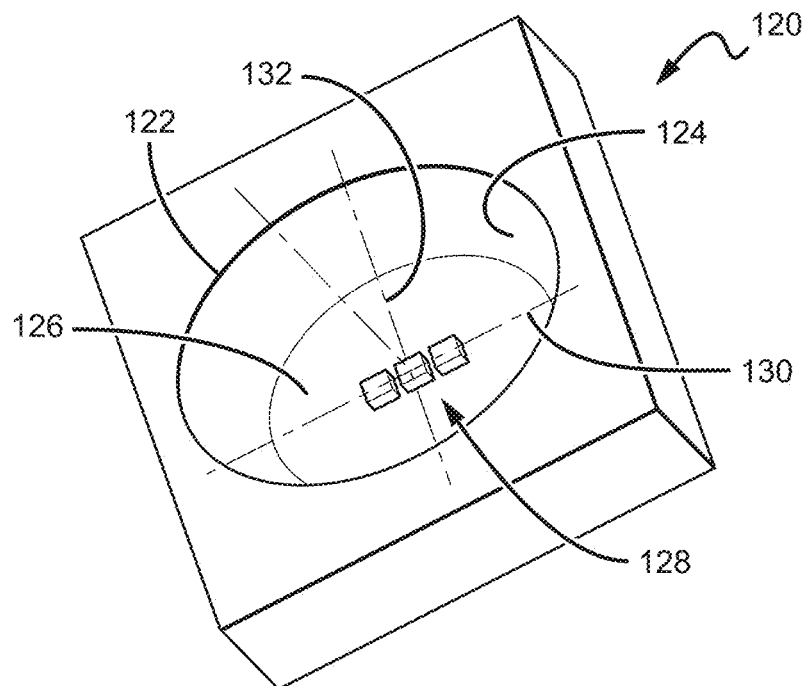
FIG. 12 is a perspective view of another embodiment of an LED package according to the present invention.

FIG. 12 shows another embodiment of an LED package 120 according to the present invention having an oval cavity 122 with an angled sidewall 124 and a planar base 126. The package 120 can also comprise emitters 128 that are mounted along the cavity's longitudinal axis 130 at the crossing point with the orthogonal axis 132. The package 120 can also comprise an oval shaped lens as described below to provide for wide angle and wide pitch emission. The cavity can be coated with reflective material as described above, and the angled sidewalls can reflect emitter light so that it contributes to useful emission from the LED package 120. Like the embodiment described above, the emitters can comprise LEDs that are placed close to one another to approximate a point light source.

Figure 13:
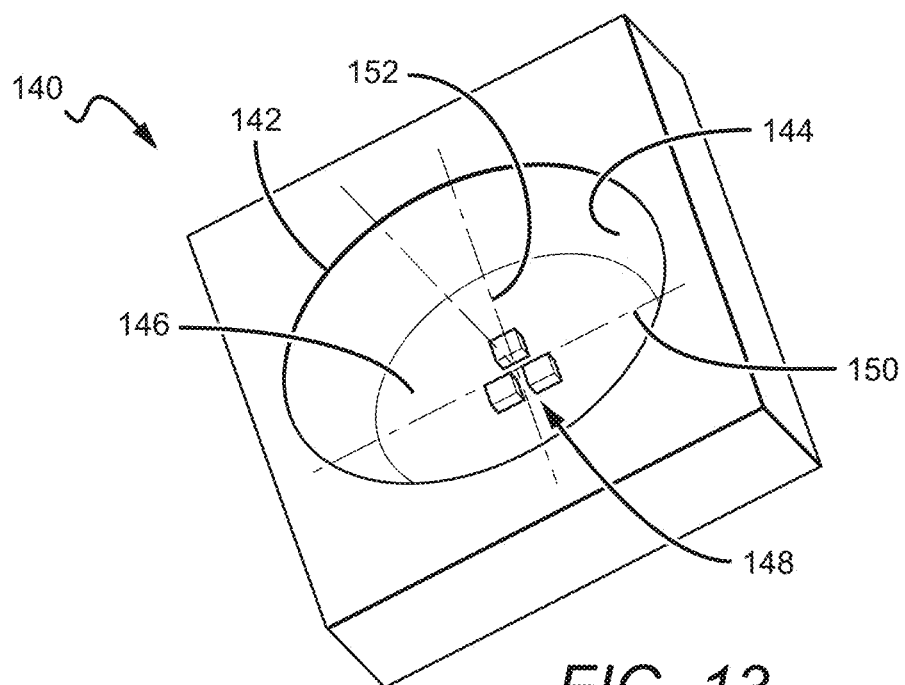
FIG. 13 is a perspective view of another embodiment of an LED package according to the present invention.

FIG. 13 shows still another embodiment of an LED package 140 according to the present invention, having a cavity 142, with an angled sidewall 144, planar base 146 and emitters 148 mounted to the planar base 146. In this embodiment, the emitters 148 are clustered around the crossing point for the longitudinal and orthogonal axis 150, 152. The emitters 148 can comprise red, green and blue LEDs mounted in a triangle about the axis crossing point. The LEDs are mounted in close proximity to one another to approximate a point light source and like the embodiments above, the LED package can comprise an oval shaped lens.

FIG. 14 shows one embodiment of a lens 160 that can be used in LED packages according to the present invention and is particularly arranged for use with a package having an oval shaped cavity with a planar base. The lenses used in the different embodiments described herein can comprise many different materials, such as an epoxy, can comprise many different refractive indexes such as 1.51, and can transmit approximately 100% of light emitted from the emitters.

The lens base 162 fits in the cavity, and the rounded upper portion 164 sits above the cavity. In some embodiments, the rounded upper portion 164 can have a dome shape, while in other embodiments the rounded upper portion 164 can have a raised portion along the longitudinal axis. In either case, the lens can shape the light from the emitters to provide a wider angle, wider pitch emission pattern compared to emitters with circular cavity and hemisphere shape.

FIG. 15 shows still another embodiment of an LED package 180 according to the present invention having a cavity 182 with an obround shape. Obround is generally known as a shape consisting of two semicircles connected by parallel lines tangent to their endpoints. This LED package 180 can have a lens (not shown) that is similar to those described above and could have a base to fit within the cavity and a generally oval shaped portion above the cavity 182. The LED package 180 has a planar base 184, with emitters 186 mounted to the planar base at or near the center point within the cavity. In the embodiment shown, the emitters can comprise red, green and blue emitting LEDs that are arranged in a triangle about the center point, but it is understood that the LED package can have different numbers of emitters that can be arranged in many different ways such as in a row, square, rectangle, etc.

Figure 16:
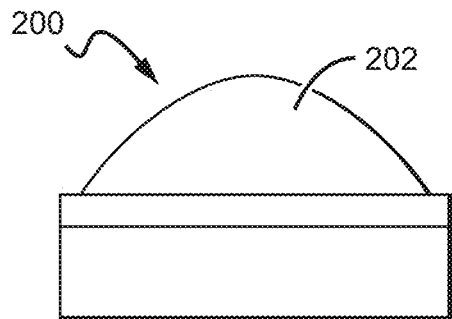
FIG. 16 is a side view of another embodiment of an LED package according to the present invention.
Figure 17:
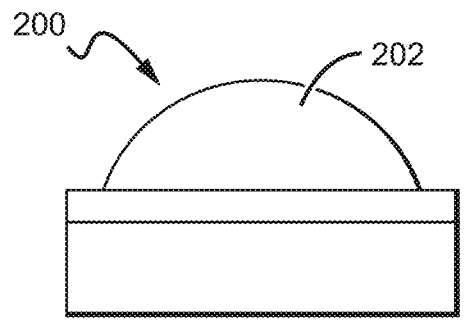
FIG. 17 is another side view of the LED package in FIG. 16.
Figure 18:
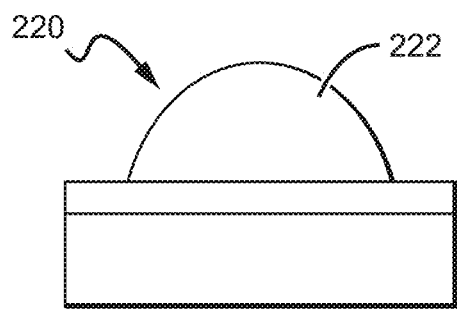
FIG. 18 is a side view of another embodiment of an LED package according to the present invention.
Figure 19:
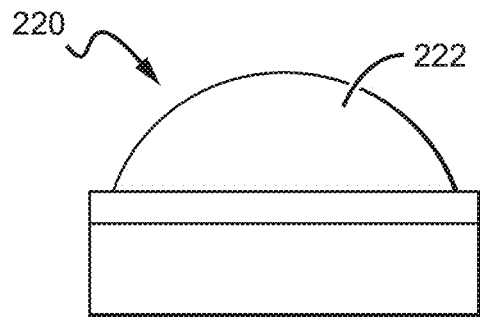
FIG. 19 is another side view of the LED package in FIG. 18.

It is understood that the LED packages according to the present invention can have oval lenses with different shapes and sizes. FIGS. 16 and 17 show another embodiment of an LED packages 200 having a lens 202, and FIGS. 18 and 19 show another embodiment of an LED package 220 having a lens 222. The lens 202 for LED package 200 is higher and covers more of the top surface around the cavity compared to the lens 222 in LED package 220. This is just one of the many different size and shape variations that can be used to obtain the desired emission patterns.

Figure 20:
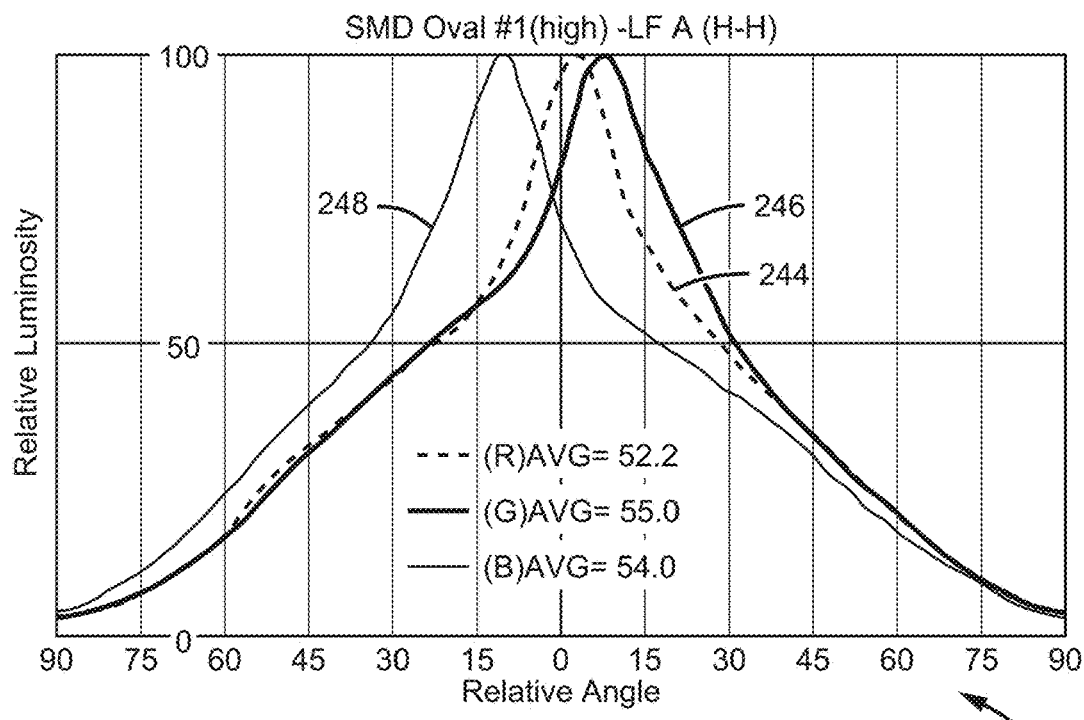
FIG. 20 is a graph showing emission patterns for one LED package according to the present invention taken along one axis.
Figure 21:
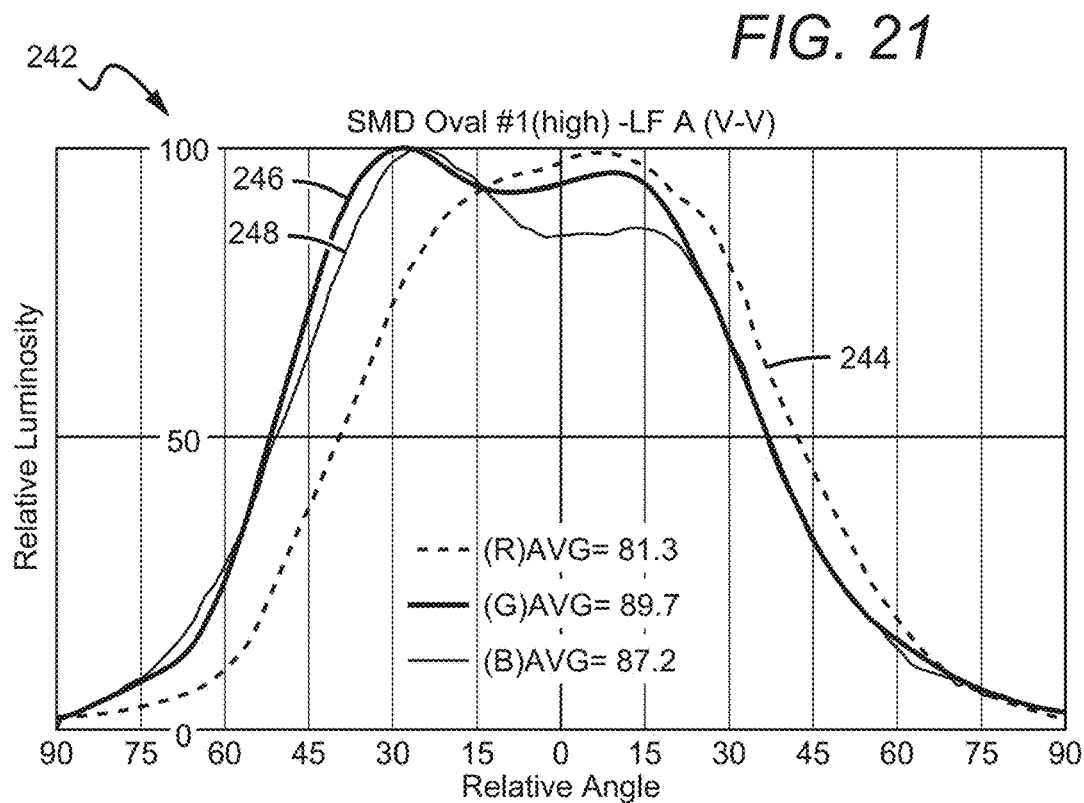
FIG. 21 is another graph for the same LED package shown in FIG. 20, taken along an orthogonal axis.
Figure 28:
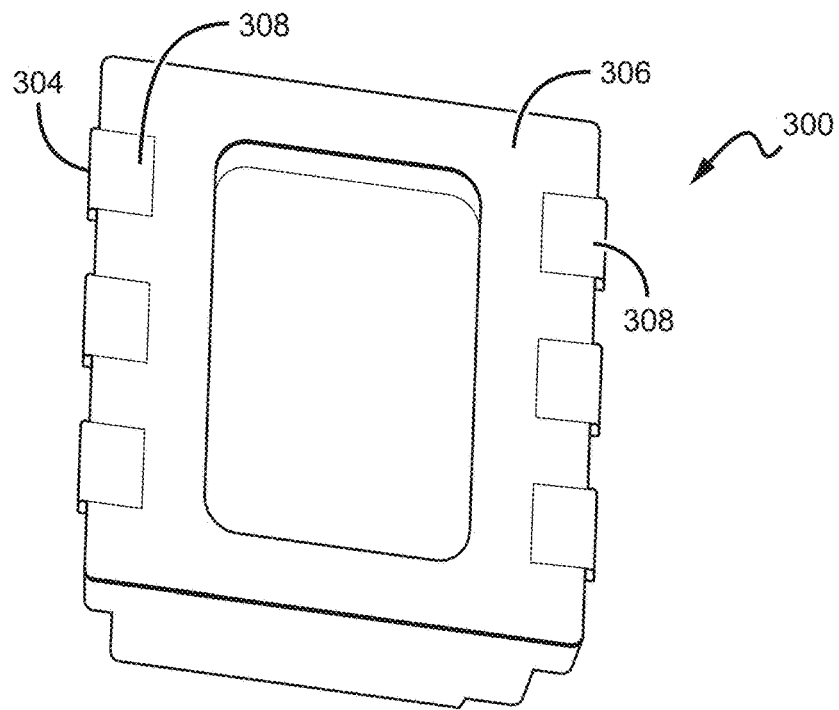
FIG. 28 is bottom perspective view of the LED package shown in FIG. 25.
Figure 29:
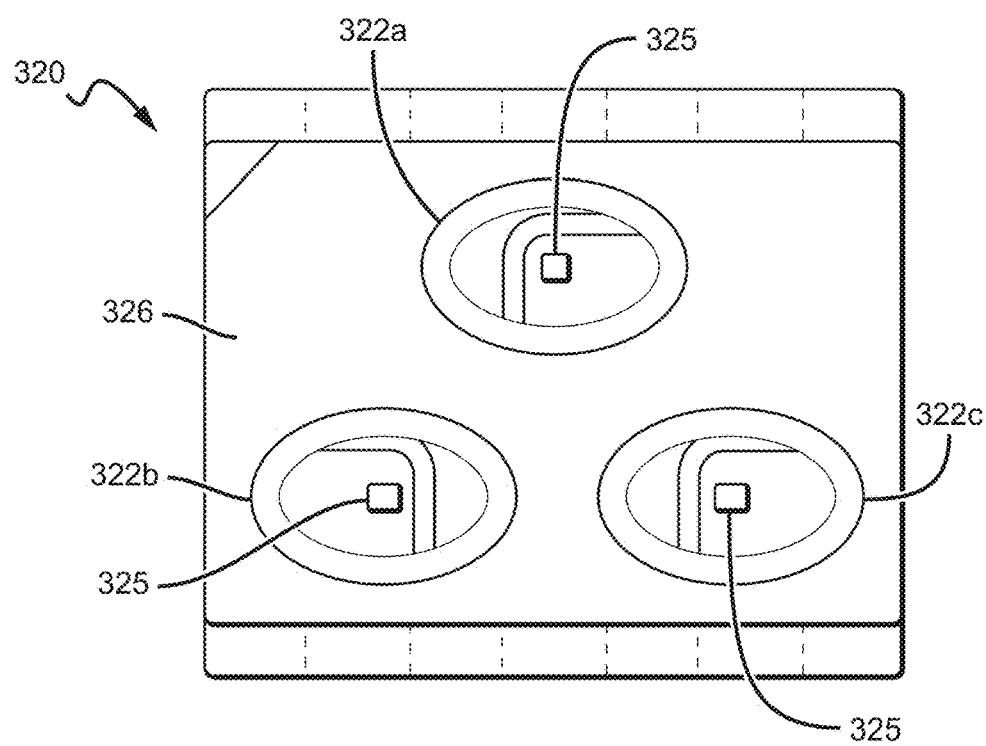
FIG. 29 is a top view of another embodiment of an LED package according to the present invention.
Figure 32:
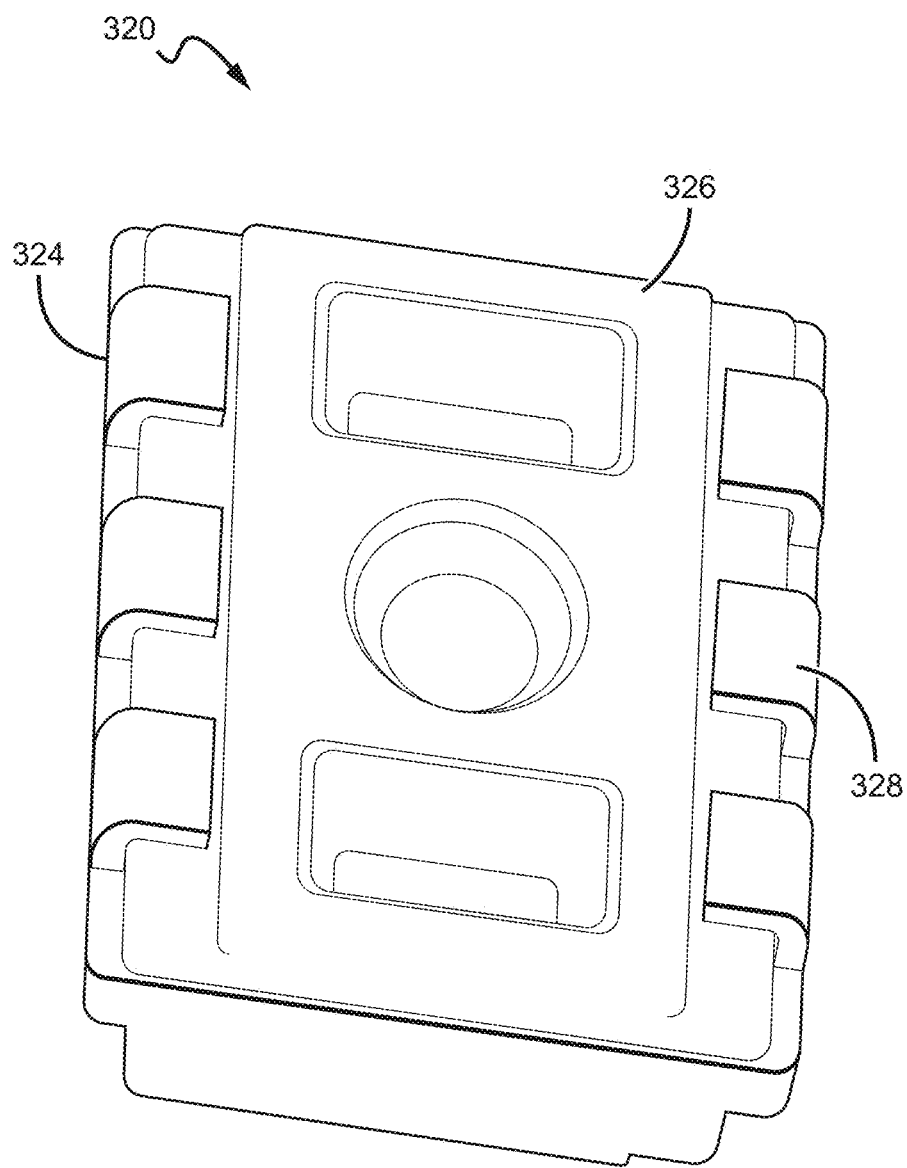
FIG. 32 is bottom perspective view of the LED package shown in FIG. 29.

FIGS. 20 and 21 are graphs 240 and 242 showing the emission profiles for red, green and blue LEDs 244, 246, 248, for LED packages similar to the one shown in FIGS. 15 and 16 with the LEDs mounted in the LED package cavity as described above. The emission profiles in graph 240 are taken along axis H-H as shown in the LED package 180 in FIG. 15. The emission profiles in graph 242 are taken along axis V-V as shown in FIG. 15.

Similarly, FIGS. 22 and 23 are graphs 260 and 262 showing the emission profiles for red, green and blue LEDs 264, 266, 268 for LED packages similar to one shown in FIGS. 17 and 18 with the LED mounted in the LED package as described above. The emission profiles in graph 240 are taken along axis H-H as shown in the LED package 180 in FIG. 15. The emission profiles in graph 22 are taken along axis V-V as shown in FIG. 15. Comparison of the graphs 240, 242 to the graphs 260, 262 illustrate that different shaped oval lenses can result in variations in emission profiles.

It is understood that the lenses according to the present invention can be arranged in many different ways. The lenses can be solid and fill the cavity, or can be at least partially hollow with voids arranged in different ways. It is also understood that the lenses can have surface variations or texturing to provide the desired LED emission pattern. Examples of these surface variations can be found in PCT International Publication No. WO 2008/086682 A1, which is incorporated herein by reference.

It is understood that the present invention can be applied to LED packages arranged in many different ways beyond those described above. FIG. 24 shows another embodiment of an LED package 280 according to the present invention having multiple cavities 282, each of which can have one or more LEDs. The package can also have respective oval shaped lenses over each of the cavities 282, or a single oval shaped lens can be formed over the cavities. The cavities can be arranged close to one another to approximate a point source. This is just one the many different LED package variations according to the present invention.

FIGS. 25-28 show another embodiment of and LED package 300 according to the present invention having multiple cavities 302a-c similar to the LED package 280 shown in FIG. 24. The LED package 300 can be arranged for surface mounting and can comprise three cavities 302a-c. It is understood that different embodiments can comprise different number of cavities such as two, four, five, or more. The cavities 302a-c can have many different shapes as the cavities described above, with the cavities 302a-c shown having an oval shape similar to the cavity shown in FIGS. 8 and 9 above. Each of the cavities 302a-c can comprise an angled side surface and a planar base for mounting an emitter, such as an LED.

The LED package 300 can have many different structures and can be fabricated using many different methods. In the embodiment shown, the LED package can comprise lead frame 304 and a body 306 that can be molded around the lead frame 304 using known methods. The molding process can also form the cavities 302a-c in the body with the lead frame accessible through the cavity. One or more emitters such as LEDs can be mounted to the exposed portion of the lead frame in each cavity. The lead frame 304 can comprise a plurality of flat pins 308 exposed at the bottom of the body 306 for surface mounting, and electrical signals applied to the pins are conducted to the emitter causing them to emit light.

It is understood that the cavities 302a-c can be arranged with many different numbers of LEDs that emit different colors of light. In different embodiments, each of the cavities 302a-c can have one or more LEDs emitting in a respective color or wavelength of light. In the embodiment shown each of the cavities can have one LED 305 that emits red, green/yellow and blue light. A red emitting LED can be mounted in cavity 302a that is adjacent and at the midpoint of side surface 306a. A blue emitting LED can be mounted in cavity 302b and a green emitting LED can be mounted in cavity 302c, with cavities 302b and 302c arranged adjacent to side surface 306b. The light from the cavities combines so that the LED package 300 emits a color combination of the light from the cavities. The intensity of the light from each of the cavities 302 can be varied based on the electrical signals applied to the lead frame 304, which allows for the LED package 300 to emit a varied color combination of light from cavities 302a-c. It is understood that in other embodiments, the cavities can have a plurality of LED emitting the same or different wavelengths of light. In one alternative embodiment, one or more of the cavities can comprise red, green/yellow and blue emitting LEDs.

The multiple cavity LED packages according to the present invention can have many different shapes and sizes, with some sized so that the light sources in the cavities are close enough to allow for efficient mixing of light from the cavities. In some embodiments, the cavities should be close enough so that the cavities approximate a point light source. In the embodiment shown, the LED package 300 has a rectangular shape, with each of the oval shaped cavities having their widest portion aligned with the longer edge of the LED package 302. In other embodiments, one or more of the cavities can be arranged in different orientations.

It is understood that the cavities 302a-c can be arranged with many different numbers of LEDs that emit different colors of light. In different embodiments, each of the cavities 302a-c can have one or more LEDs emitting in a respective color or wavelength of light. In the embodiment shown each of the cavities can have one LED 305 that emits red, green/yellow and blue light. A red emitting LED can be mounted in cavity 302a that is adjacent and at the midpoint of side surface 306a. A blue emitting LED can be mounted in cavity 302b and a green emitting LED can be mounted in cavity 302c, with cavities 302b and 302c arranged adjacent to side surface 306b. The light from the cavities combines so that the LED package 300 emits a color combination of the light from the cavities. The intensity of the light from each of the cavities 302 can be varied based on the electrical signals applied to the lead frame 304, which allows for the LED package 300 to emit a varied color combination of light from cavities 302a-c. It is understood that in other embodiments, the cavities can have a plurality of LED emitting the same or different wavelengths of light. In one alternative embodiment, one or more of the cavities can comprise red, green/yellow and blue emitting LEDs. In other embodiments, one or more of the cavities can have emitters emitting the same color of light, while in other embodiments one or more of the cavities emits non-visible light such as infrared (IR) light.

Some embodiments of LED packages can have side surfaces that are less than 20 mm long, and can have cavities that are less than 10 mm wide, with a depth of less than 2 mm. In other embodiments, the LED packages can have side surfaces that are less than 10 mm long, and can have cavities that are less than 5 mm wide, with a depth of less than 1 mm. In the embodiment shown, the side surfaces of the LED package can be approximately 8 mm by 5.6 mm. The cavities can be oval shaped measuring approximately 3 mm by 2 mm at the top surface of the package and having a depth of approximately 0.45 mm. In some embodiments, the widest portion of the cavities should be less than half the length of the longest side of the LED package, and the narrowest portion should be less than one third of the longest side of the package. In the embodiment shown, each of the cavities is the same size and shape, but it is understood that other embodiments can have cavities with different shapes and sizes.

As best shown in FIG. 27, each of the cavities comprises a respective oval shaped lens 310 as described above. The lenses can help shape the emission of the package to provide wide angle or wide pitch emission along an axis or centerline of the LED package compared to an LED package with circular cavity and hemispheric lens. It is understood that other embodiments can have different shaped lenses or can have lenses of different sizes.

FIGS. 29-32 show another embodiment of an LED package 320 according to the present invention that is similar to the LED package 300 described above. LED package 320 comprises oval shaped cavities 322a-c, a lead frame 324, and a body 326, all of which can be arranged and formed as described above. Each of the cavities 322a-c can have one or more LEDs 325 as described above. The lead frame 324 is different from the LED package 300 and comprises pins 328 that fold under the body 326 in a known SMD arrangement. The LED package 320 can also comprise oval lenses 330 in each of the cavities as described above. This is only one of the many variations that can be included in LED packages according to the present invention.

It is understood that many other surface mount arrangements can be used to provide the desired wide-angle emission, beyond the embodiments described above. It is also understood that the features of the different embodiments can be combined to achieve the desired emission profile. That is, the different LED packages in a display can have different emission profiles that combine to provide the desired display emission.

Figure 33:
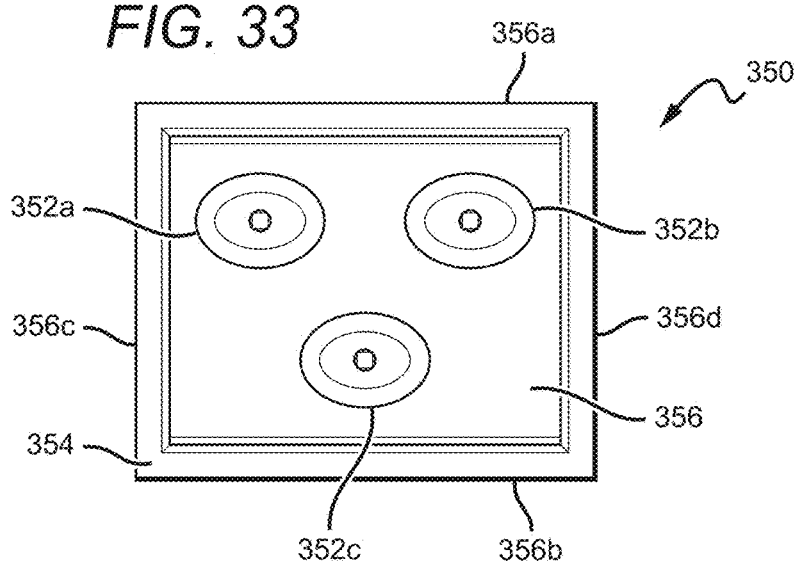
FIG. 33 is a top view of another embodiment of an LED package according to the present invention.

It is understood that different embodiments of LED packages according to the present invention can be arranged in many different ways beyond the embodiments described above. FIGS. 33-41 shows different embodiments of LED packages according to the present invention, with cavities arranged in different patterns. FIG. 33 show a package 350 according to the present invention having first, second and third cavities 352a-c, similar to the LED package 300 shown in FIG. 25 and described above. Like the embodiments above, the LED package 350 can be arranged for surface mounting and can have many different shapes as described above. In the embodiment shown, the cavities 552a-c can have an oval shape with each comprising an angled side surface and a planar base for mounting an emitter, such as an LED.

The LED package 350 has a body 356 with generally rectangular footprint, but it is understood that other embodiments can have different shaped footprints. The body has a first longitudinal side surface or edge 356a with an opposite second longitudinal side surface 356b. The body 356 also has a first orthogonal side surface 356c and opposite second orthogonal side surface 356d. The body 356 also has a step 354 around its perimeter that has many advantages such as an improved moisture barrier as described in more detail below. In LED package 350, the cavities 356a-c are arranged in a triangle pattern similar to the LED package 300 described above, but in this embodiment the first and second cavities 352a, 352b arranged adjacent to and along the first longitudinal edge 356a, and the third cavity 352c adjacent to and midpoint along the second longitudinal edge 356b. It is understood that the cavities 352a-c can have different colors of LEDs, and can have different dimensions as described above.

Figure 34:
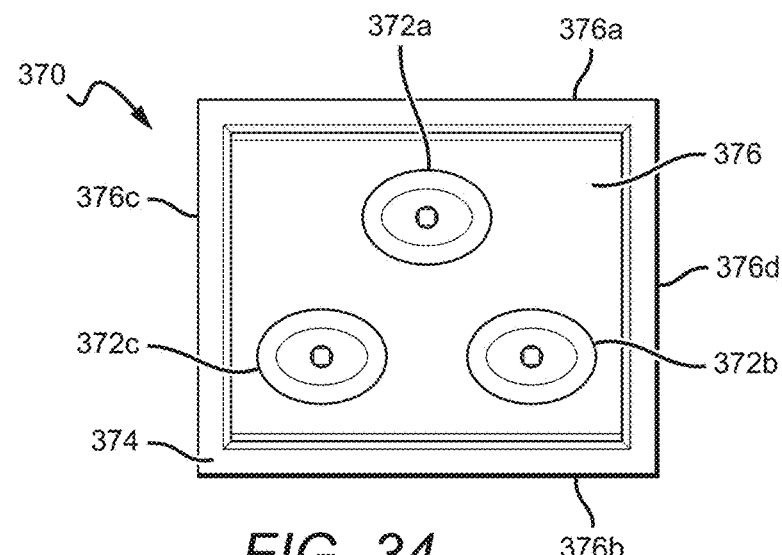
FIG. 34 is a top view of another embodiment of an LED package according to the present invention.

FIG. 34 shows another embodiment of an LED package 370 that is similar to the LED package 350 and comprises cavities 372a-c in the body 376 that also comprises a step 374 and edges 376a-d. In this embodiment, the cavities 372a-c are arranged in pattern similar to the pattern in LED package 300 described above. In this embodiment, the first and second cavity 372a is adjacent to and midway along the first longitudinal edge 376a, and the second and third cavities 372b, 372c are adjacent to and along the second longitudinal edge 376b.

Figure 35:
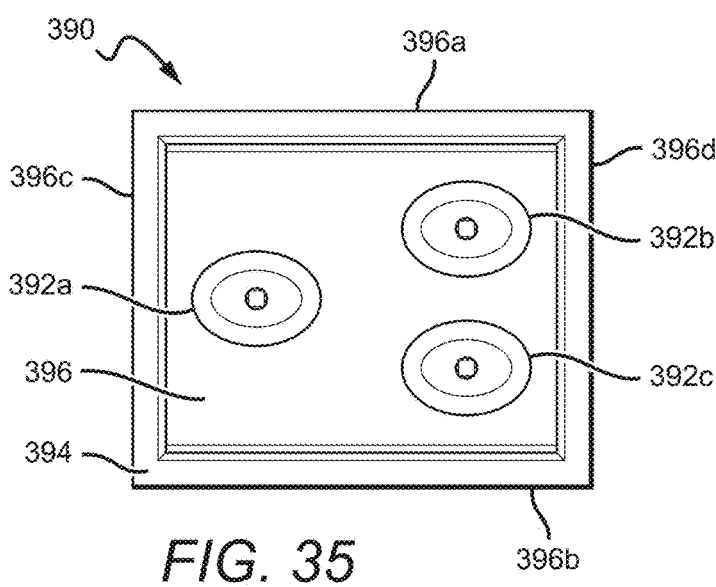
FIG. 35 is a top view of another embodiment of an LED package according to the present invention.
Figure 36:
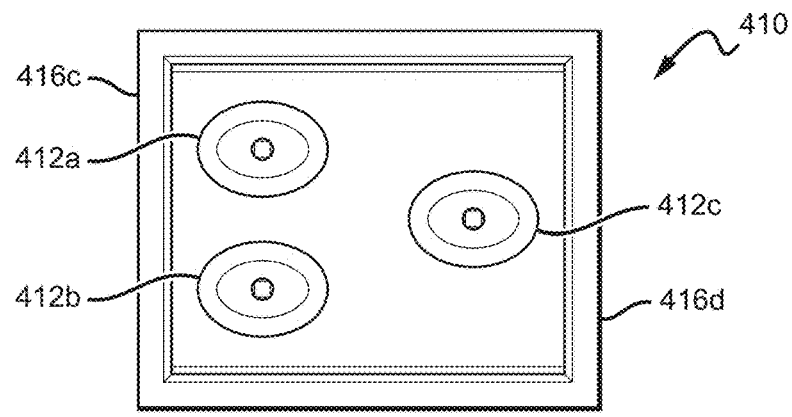
FIG. 36 is a top view of another embodiment of an LED package according to the present invention.

FIG. 35 shows another embodiment of an LED package 390 that comprises cavities 392a-c in a body 396, that also comprises a step 394 and edges 396a-c. In this embodiment, the first cavity 392a is adjacent to and midpoint along orthogonal surface 396c, and second and third cavities 392b, 392c are adjacent to and along opposing surface 396d. FIG. 36 shows a similar LED package 410 with first and second cavities 412a, 412b adjacent to and along first orthogonal edge 416c, and a third cavity 412c is adjacent to and midpoint along second orthogonal edge 416d.

Figure 37:
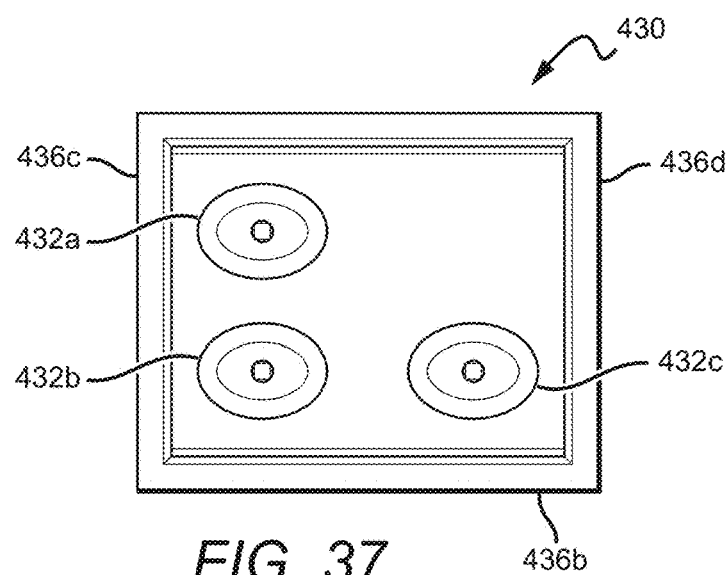
FIG. 37 is a top view of another embodiment of an LED package according to the present invention.
Figure 38:
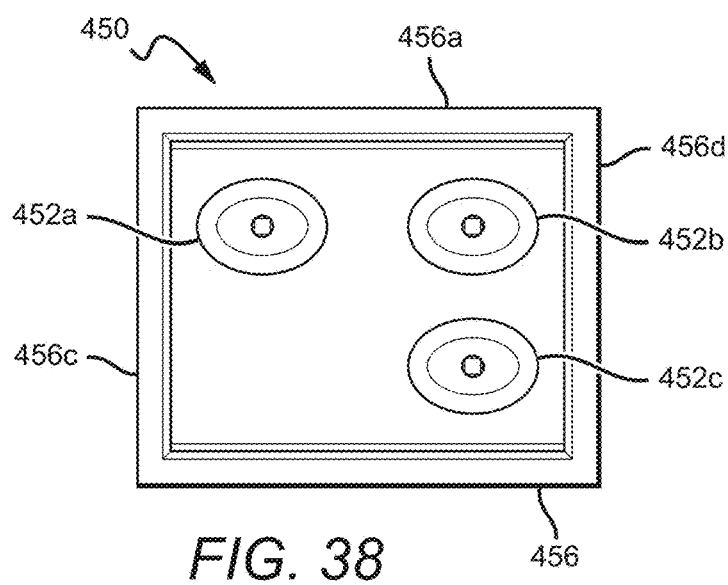
FIG. 38 is a top view of another embodiment of an LED package according to the present invention.

FIGS. 37 to 40 show different embodiments of LED packages with cavities in an L-shaped pattern. FIG. 37 shows one embodiment of an LED package 430 with first and second cavities 432a, 432b adjacent to and along side surface 436c, and third cavity 432c at the corner of surface 436b and surface 436d. FIG. 38 shows LED package 450 having a first cavity 452a at the corner of surface 456a and surface 456c, and second and third cavities 452b, 452c along surface 456d. FIG. 39 shows another embodiment of an LED package 470 that is similar to LED package 450, but has a first cavity 472a at the corner of surface 476c, 476b. FIG. 40 shows still another embodiment of an LED package 490 with an L-shaped cavity pattern that is similar to the LED package 430 in FIG. 37. In this embodiment, however, the third cavity 492c is at the corner of surface 496a and surface 496d. It is understood that the above embodiments show only some of the many cavity patterns that can be used in LED packages according to the present invention.

FIG. 41 shows another LED package 510 that is similar to the LED packages described above, but has four cavities 512a-d as opposed to three cavities. In this embodiment, the cavities 512a-d are arranged in a square pattern, but it is understood that in other embodiments the cavities 512a-d can be arranged in different patterns. The cavities 512a-c can hold many different LEDs, with one embodiment having respective red, green and blue LEDs in three of the cavities, with the light from these LEDs combining to emit different colors of light, including white. The fourth cavity can have white emitting LED that can comprise a blue emitting LED covered by a conversion material. In this embodiment, white light from the fourth cavity can be used in applications requiring a higher color rendering index (CRI) than the white light from a combination of light from the red, green and blue LEDs.

In still other embodiments, the four cavities 512a-d can comprise different combinations of red, green, blue, amber or white emitters. The four cavities 512a-d can also have two or more cavities with the same emitters. In one such embodiment, two cavities can each have a red emitter, and the remaining two cavities have emitters of different colors, such as one cavity with a blue emitter and one with a green emitter. This is only one of the many different embodiments of cavities with the same emitters. In still other embodiments, the four cavities 512a-d can include one or more cavities with emitters emitting non-visible light. In some embodiments, this can include three cavities with visible emitters, and one with an IR emitter, such as sensor IR LED.

It is understood that these different combinations can also be used in three cavity LED packages. In particular, three cavity embodiments can have the same emitters in two of the cavities or can have one or more with IR emitters as described above.

As mentioned above, different embodiments of LED packages according to the present invention can have one or more steps on the side surfaces of the body to help reduce moisture penetration and to provide a surface for forming of the encapsulant. It is understood that not all embodiments according to the present invention have steps.

Figure 42:
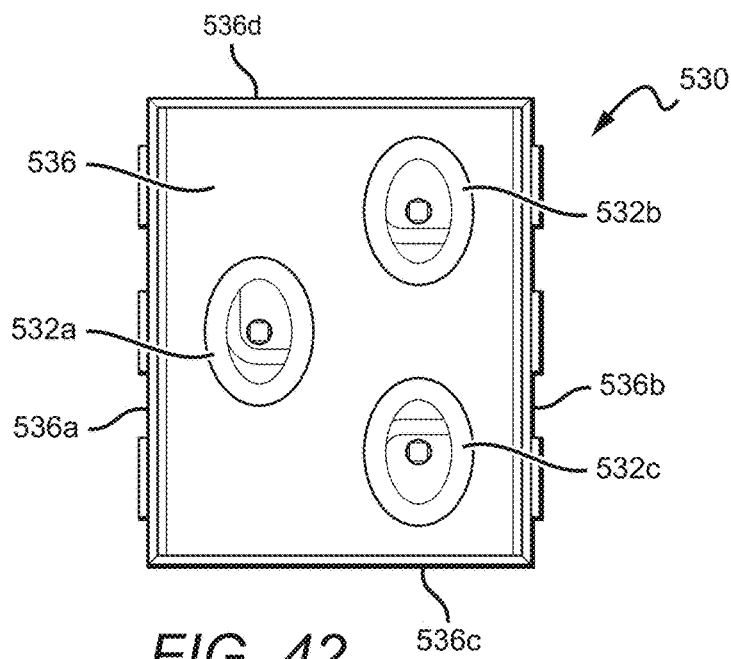
FIG. 42 is a top view of another embodiment of an LED package according to the present invention.
Figure 43:
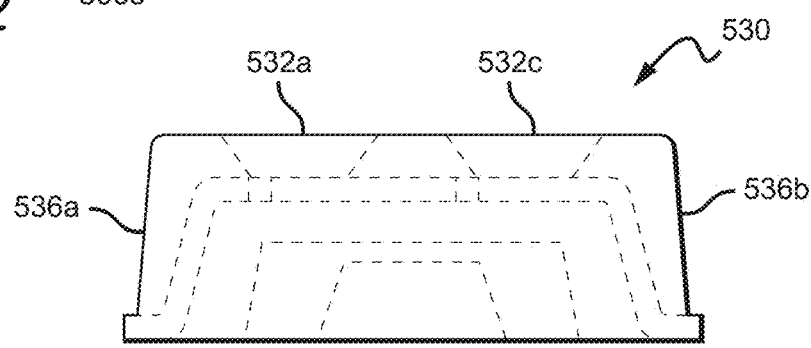
FIG. 43 is a side view of the LED package shown in FIG. 42.

FIGS. 42 and 43 show another embodiment of LED package 530 according to the present invention having a body 536 with three cavities 532a-c. In this embodiment, the body 536 has straight side surfaces (i.e. no step or transition) 536a-d, which allows for the body footprint to be small. This can be useful in certain applications such as high density displays where the emitters should be as close together as possible.

Figure 44:
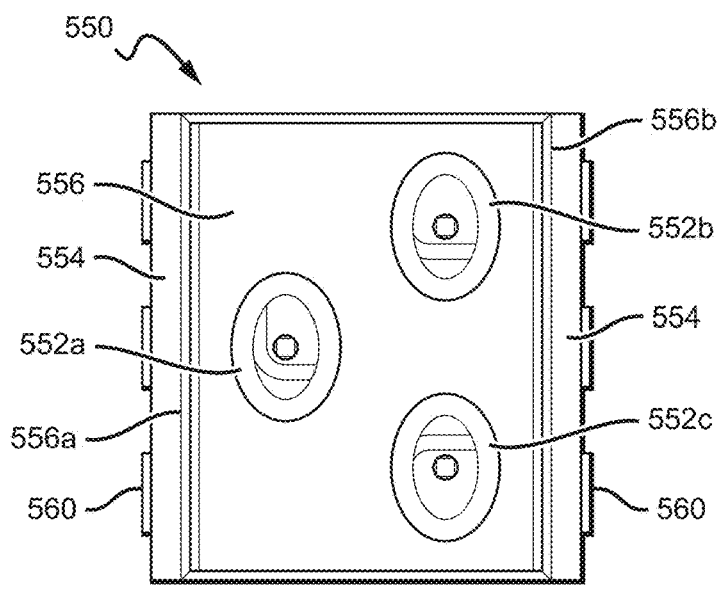
FIG. 44 is a top view of another embodiment of an LED package according to the present invention.
Figure 45:
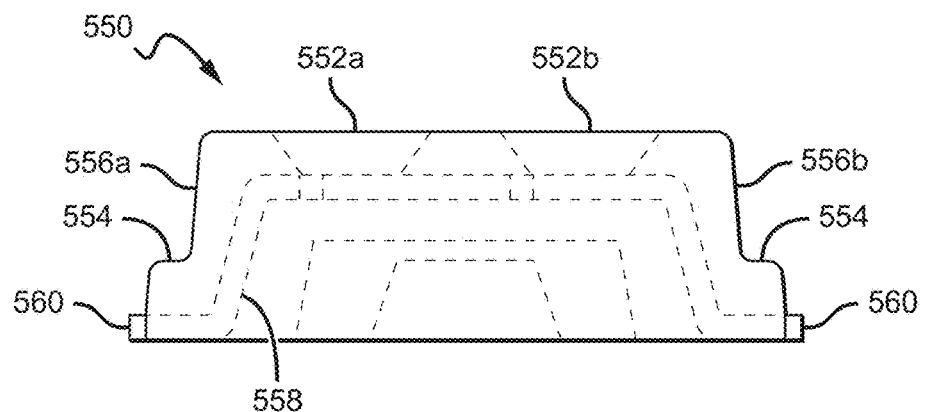
FIG. 45 is a side view of the LED package shown in FIG. 44.

FIGS. 44 and 45 show another embodiment of LED package 550 according to the present invention having a body 556 cavities 552a-c similar to those described above with the body having longitudinal side surfaces 556a, 556b. In this embodiment, the side surfaces 556a, 556b have a step 554 that can result in the body 556 having a widened lower portion and larger footprint. The step 554 can provide the advantage of protecting extended package contact leads. The LED package 550 comprises a lead frame 558 with the body 556 formed around the lead frame 558. Contact leads (or pins) 560 extend from the body 556 at the bottom surface of the body 556. The step 554 provides an extended portion of the body that covers the contact leads 560 and by providing this lower widened portion, the step 554 allows for longer contact leads compared to embodiments without the step 554 (e.g. LED package 530 described above). By having extended contact leads, the package 550 can provide for more reliable initial mounting and contact, and more reliable contacting through the life of the package 550.

Figure 46:
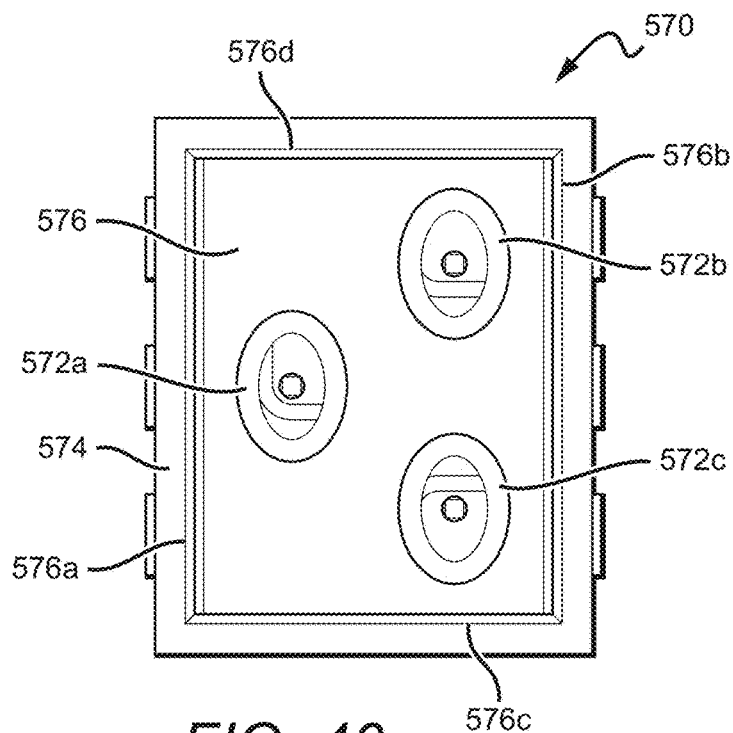
FIG. 46 is a top view of another embodiment of an LED package according to the present invention.
Figure 47:
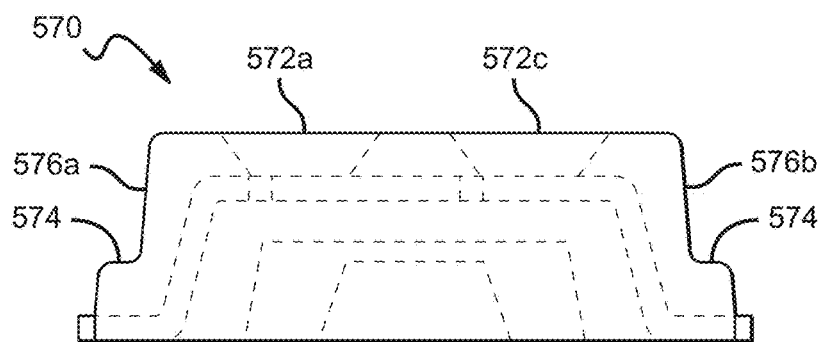
FIG. 47 is a side view of the LED package shown in FIG. 46.

FIGS. 46 and 47 show another embodiment of an LED package 570 according to the present invention also comprising three cavities 572a-c in its body 576. In this embodiment, the step 574 is on all side surfaces 576a-d, which can increase the body footprint even further. The step 574 provides the advantage of protecting extended contact leads, and by being on all side surfaces the step provides a ledge to hold the encapsulant during package fabrication. This results in reliable encapsulant formation and a reliable barrier to moisture intrusion as described in more detail below, and prevents excess encapsulant material from running along the edges of the body during fabrication.

Figure 48:
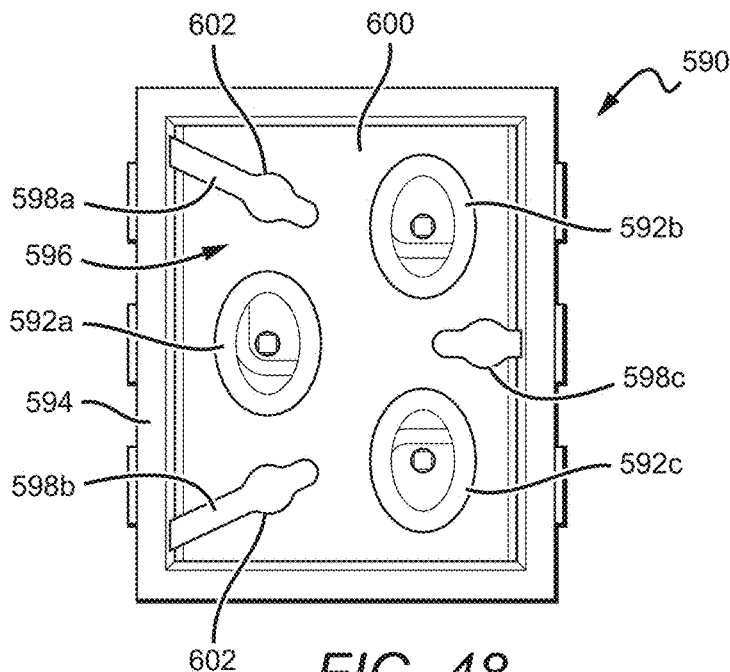
FIG. 48 is a top view of another embodiment of an LED package according to the present invention.
Figure 49:
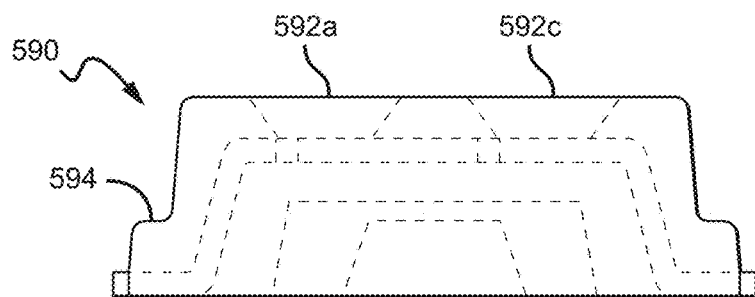
FIG. 49 is a side view of the LED package shown in FIG. 48.

LED packages used in different applications, such as outdoor displays, moisture intrusion can be a concern with moisture intrusion potentially leading to device failure. Different embodiments according to the present invention can include features to minimize or eliminate moisture intrusion. Some of these features provide for reliable formation of the encapsulant over the body by more reliably anchoring the encapsulant to the body. FIGS. 48 and 49 show another embodiment of an LED package 590 according to the present invention comprising cavities 592a-c in body 596, and a step 594 around to the side surfaces of the body 596, as described above. In this embodiment, notches or fingers 598a-c are included in the top surface of the body 596 to cooperate with the encapsulant to help anchor the encapsulant to the body and help avoid intrusion of moisture and contaminants. The notches can take many different shapes and in the embodiment shown the notches 598a-c comprise fingers running from the edge of the top surface 600 of the body 596 toward the middle of the top surface 600. The notches 598a-c have a widened head portion 602 toward the end of each notch that provides a further feature to help anchor the encapsulant.

It is understood that the LED packages according to the present invention can have different numbers of notches and can have notches with many different shapes and sizes. The notches can be formed using many different methods including formation when molding the body to the lead frame or etching after the body is formed. The notches can be in many different locations, such as on the body's side surfaces and can have many different depths. Secondary features can also be included at the base of the notches to further enhance anchoring of the encapsulant. These secondary features can comprise additional notches, cuts, cutouts or texturing.

Figure 50:
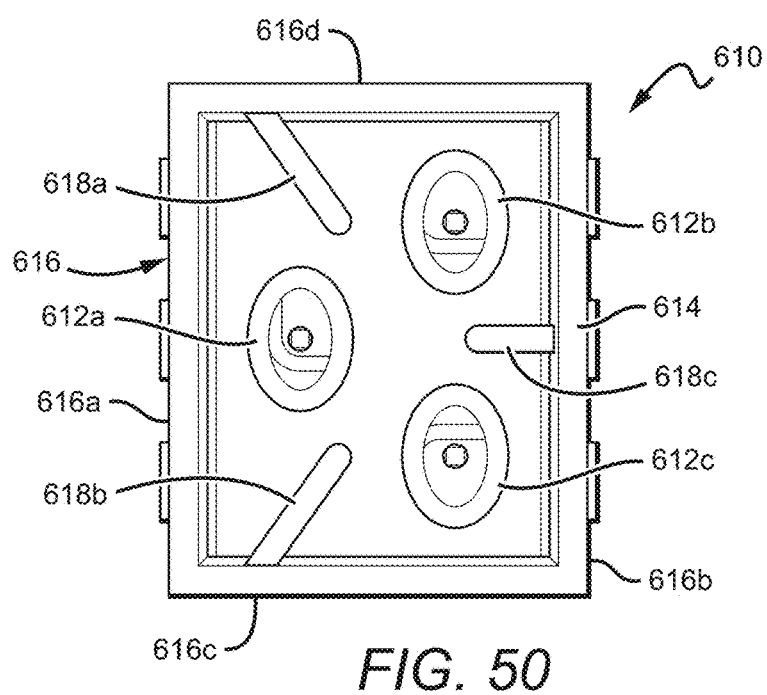
FIG. 50 is a top view of another embodiment of an LED package according to the present invention.

FIG. 50 shows another embodiment of an LED package 610 according to the present invention comprising cavities 612a-c in body 616, and a step 614 around to the side surfaces 616a-d of the body, all as described above. In this embodiment, the body 616 includes three notches 618a-c having a different shape and in different location than the notches described above. In the embodiment, the notches 618a-c have uniform width along their length, with the first notch 618a originating from and running at an angle to the fourth side surface 616d, the notch 618b originating from and running at an angle to the third side surface 616c, and the third notch 618c originating from and running generally orthogonal to the second side surface 616b.

Figure 51:
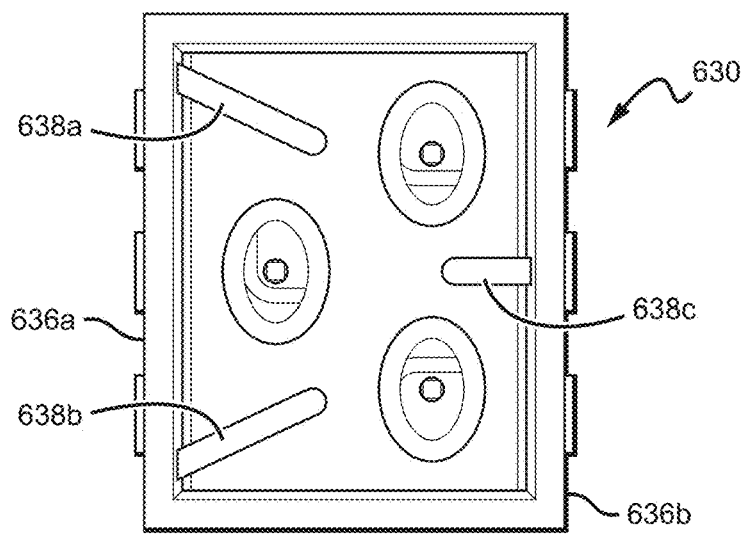
FIG. 51 is a top view of another embodiment of an LED package according to the present invention.

FIG. 51 shows another embodiment of an LED package 630 that is similar to package 610, and has three notches 638a-c with generally the same shape. In this embodiment, however, at least one of the notches originates from a different location. The first and second notches 638a, 638b originate from and run at an angle to the first side surface 636a, with the third notch 638c originating from and running generally orthogonal to the second side surface 636b.

Figure 52:
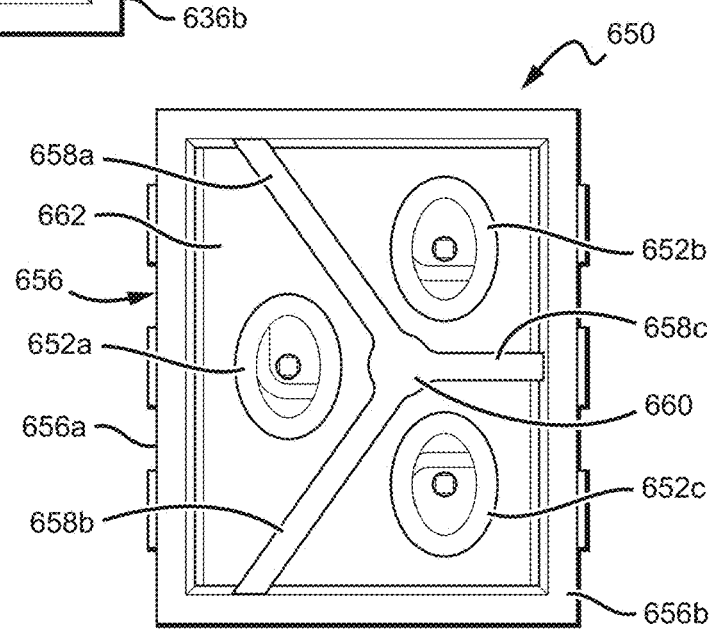
FIG. 52 is a top view of another embodiment of an LED package according to the present invention.

FIG. 52 shows still another embodiment of an LED package 650 according to the present invention with notches 658a-c that originate at different side surfaces but interconnected near the center of the top surface 662 of the body 656. Like the embodiment above, the first and second notches 658a, 658c originate from and run at an angle to the first side surface 656a, with the third notch 658c originating from and running generally orthogonal to the second side surface 656b. An enlarged interconnect section 660 is included between the cavities 652a-c where the notches 658a-c interconnect, with the enlarged section further enhancing anchoring of an encapsulant to the body 656.

Figure 53:
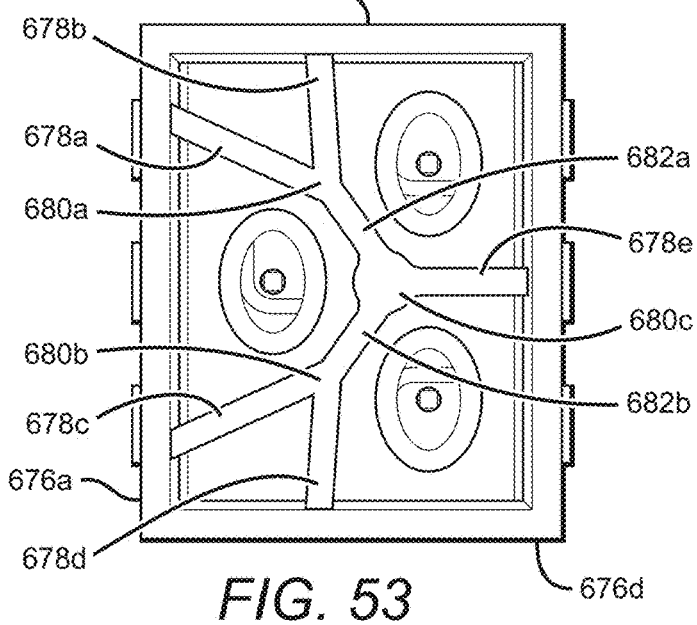
FIG. 53 is a top view of another embodiment of an LED package according to the present invention.

FIG. 53 shows still another embodiment of and LED package 670 having five notches 678a-e with three interconnect points 680a-c, all interconnected in notch network. First and second notches 678a, 678b originate from first and third side surfaces 676a, 676c, respectively, and meet at first interconnect point 680a. Third and fourth notches 678c, 678d originate from first and fourth side surfaces 676a, 676d, respectively, and meet at second interconnect point 680b. First and second secondary notches 682a, 682b run from first and second interconnect points 680a, 680b, respectively, to the third interconnect point 680c. The fifth notch 678e runs from second side surface 676d to the third interconnect point 680c, with the third interconnect point also comprising an enlarged section for enhanced anchoring.

Figure 54:
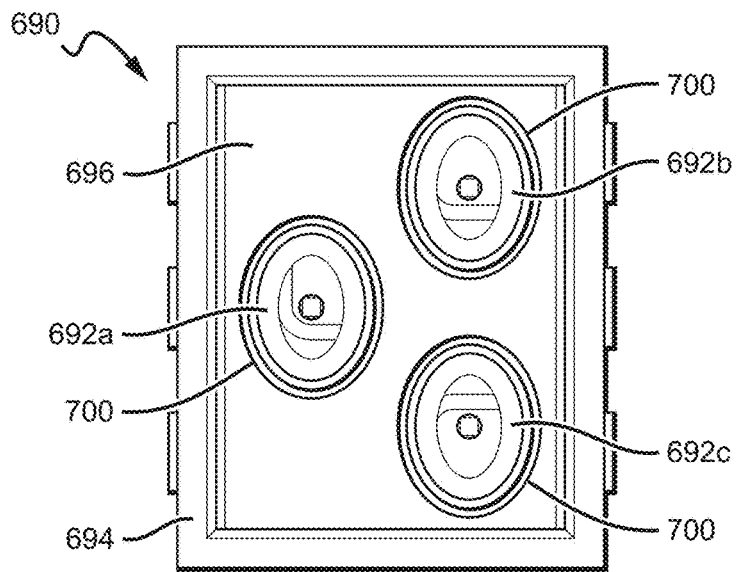
FIG. 54 is a top view of another embodiment of an LED package according to the present invention.
Figure 55:
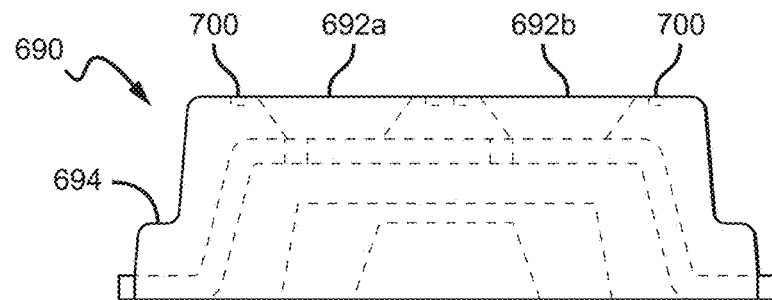
FIG. 55 is a side view of the LED package shown in FIG. 54.
Figure 56:
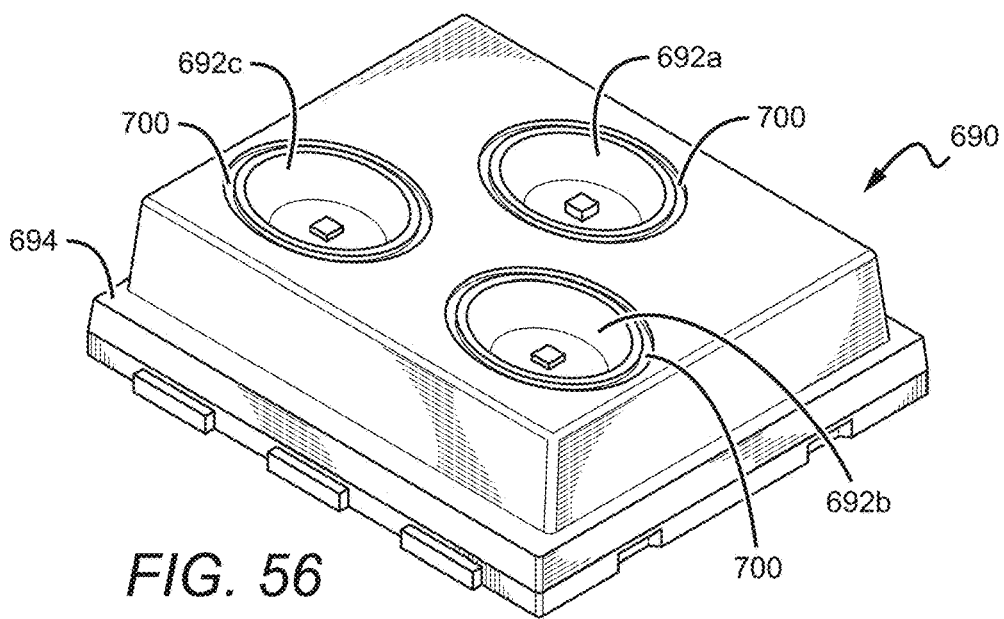
FIG. 56 is a perspective view of the LED package shown in FIG. 54.

The LED packages according to the present invention can also have other features to enhance anchoring of the encapsulant and minimize moisture intrusion. FIGS. 54 to 56 show another embodiment of an LED package 690 having a body 696, with cavities 692a-c and a step 694 as described above. In this embodiment, an oval shaped moat 700 is included around each of the cavities 692a-c. When the encapsulant is formed on the body 696 it fills the cavities 692a-c and each of their corresponding moat 700. The cooperation of the moat 700 and encapsulant provides a further anchor of the encapsulant to the body and a barrier to moisture intrusion.

It is understood that moats according to the present invention can have many different sizes and shapes, with some alternative shapes being circular, triangle, square, rectangle, pentagon, octagon, etc. The moat can be close to the edge of the cavities or can be spaced further back, and other moats can have different shapes for the cross-section, and can have various secondary features to further enhance anchoring.

Figure 57:
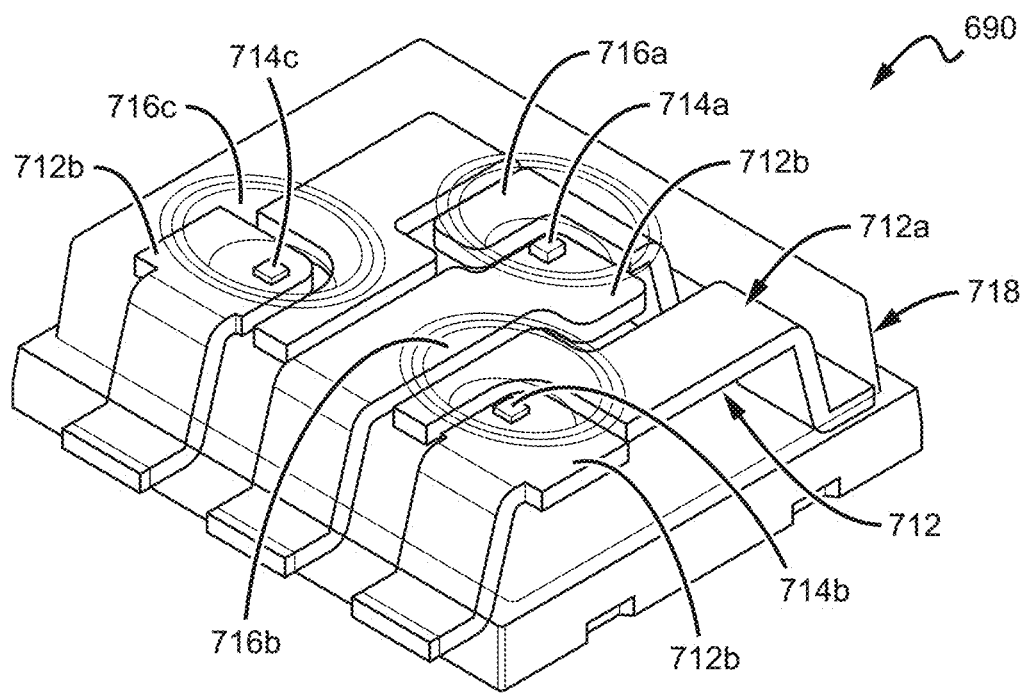
FIG. 57 is a perspective view of one embodiment of a lead frame according to the present invention.
Figure 58:
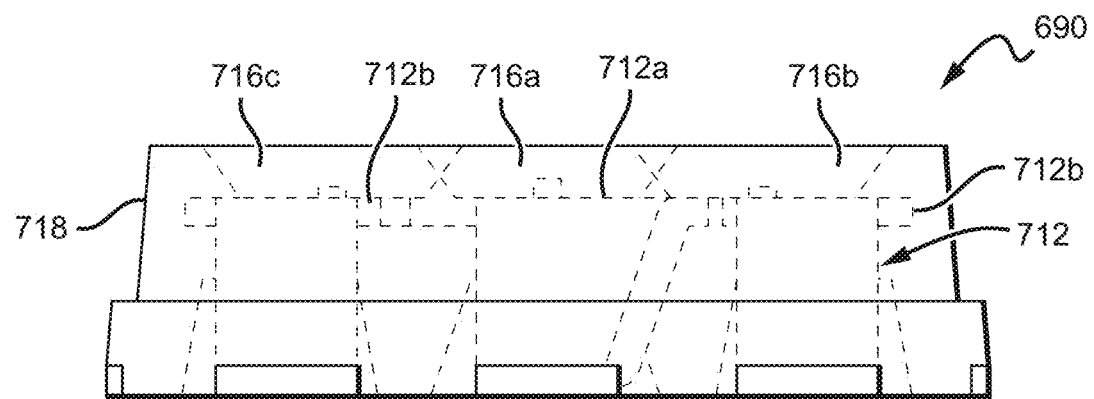
FIG. 58 is a side view of the lead frame shown in FIG. 57.

FIGS. 57 and 58 show an LED package lead frame 712 according to the present invention that can be used in any LED package described herein, but it shown used with LED package 690. The upper portion 712a of the lead frame is generally horizontal and forms a plateau having sites for mounting of the emitters 714a-c such that they each emits out one of the cavities 716a-c. The lead frame 712 can also provide locations for wire bonds (not shown) as needed for applying an electrical signal to the emitters 716a-c. The leads in the upper portion 712a provide nearly full coverage at the plateau, with spaces provided between the leads for electrical isolation. In some embodiments, the leads in the plateau can cover 70% or more, while other embodiments can cover 80% or more. Still other embodiments can have 90% coverage or more. This nearly full coverage is provided by widened portions 712b that enhance heat spreading and also provide additional edges or channels that enhance anchoring of the lead frame 712 to the body 718. These are only some of the anchoring features that can be included in the lead frame 712, with other features including, but not limited to, cut-outs, projections and texturing.

Figure 59:
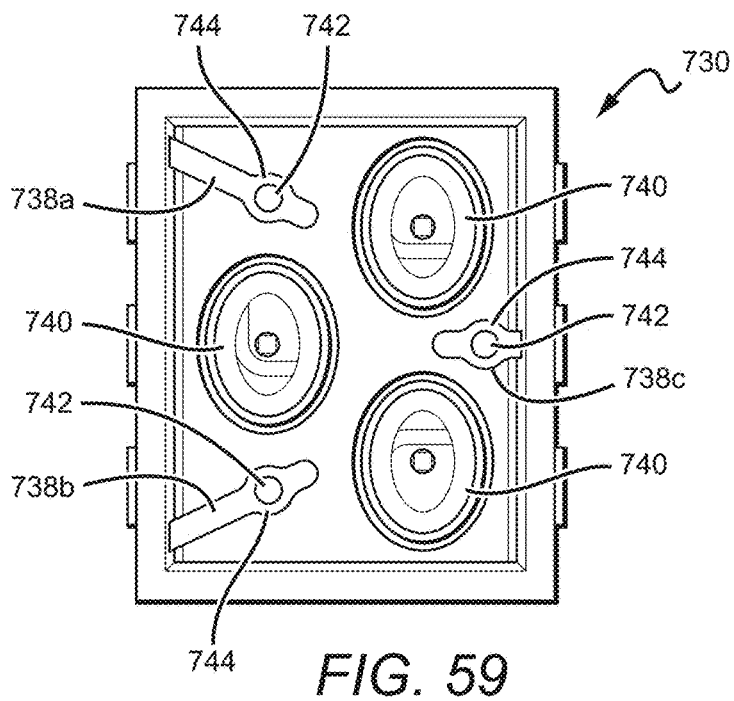
FIG. 59 is a top view of another embodiment of an LED package according to the present invention.
Figure 60:
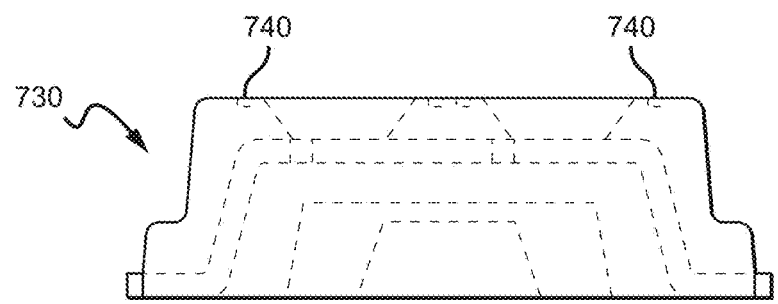
FIG. 60 is a side view of the LED package shown in FIG. 59.
Figure 61:
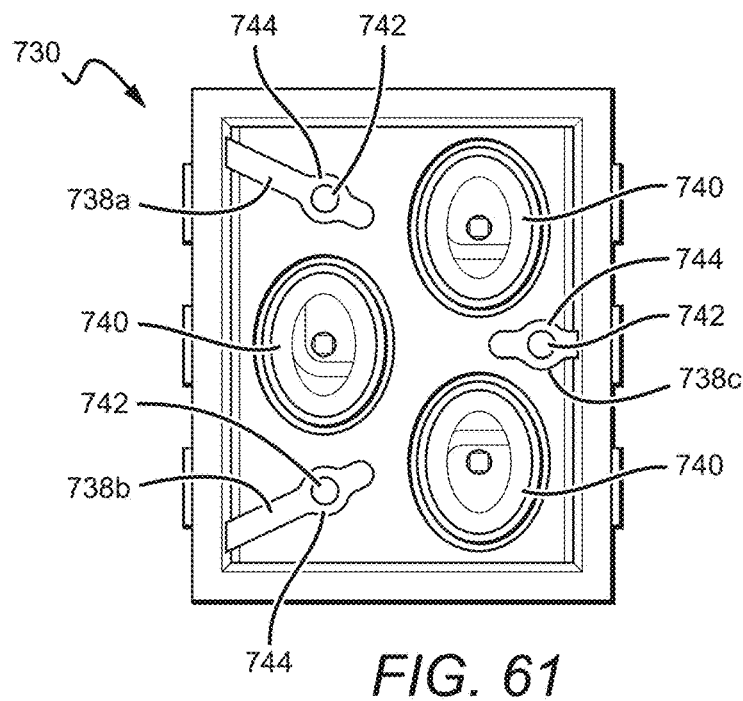
FIG. 61 is a perspective view of the LED package shown in FIG. 59.
Figure 62:
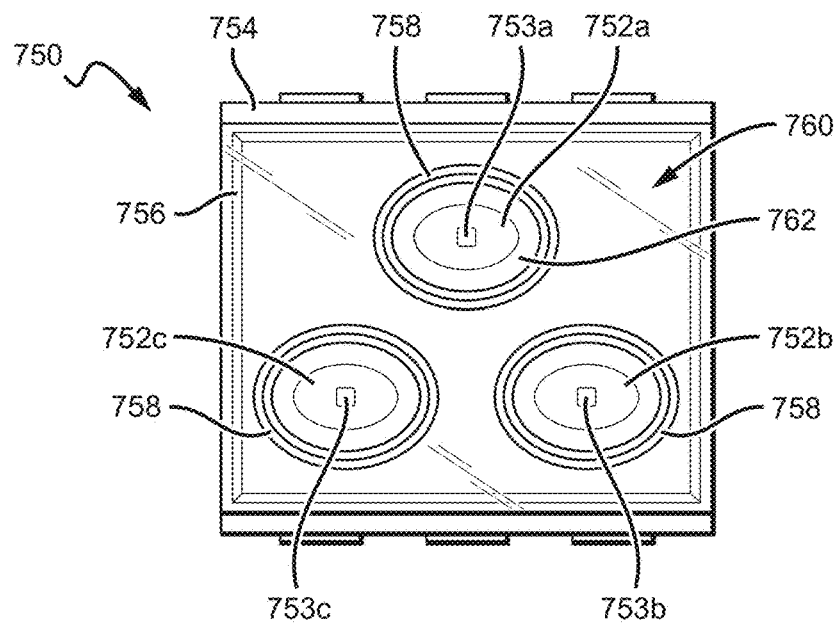
FIG. 62 is top view of another embodiment of an LED package according to the present invention.
Figure 63:
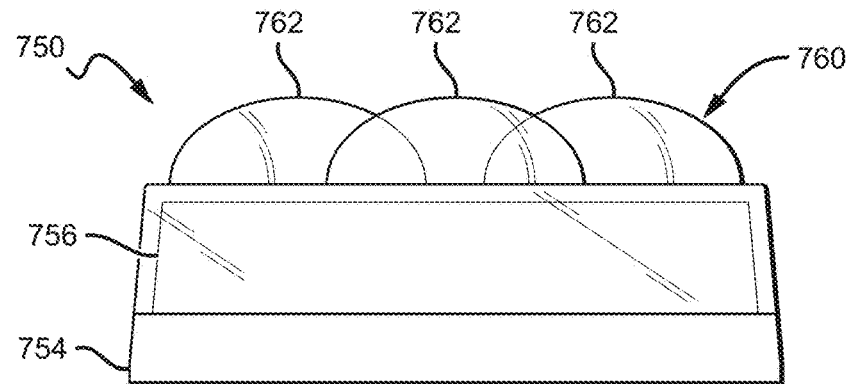
FIG. 63 is a front view of the LED package shown in FIG. 62.
Figure 64:
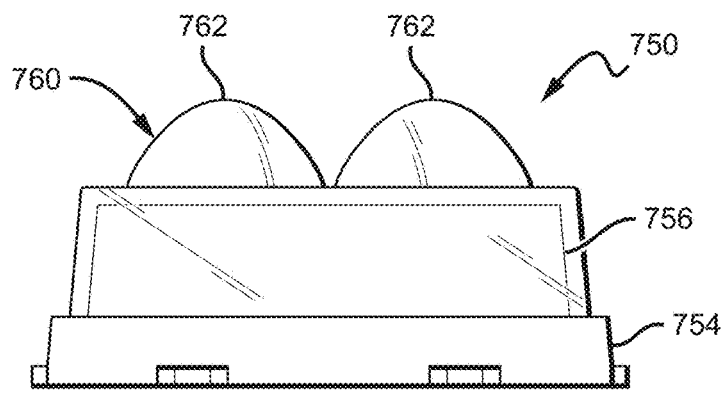
FIG. 64 is a side view of the LED package shown in 62.
Figure 65:
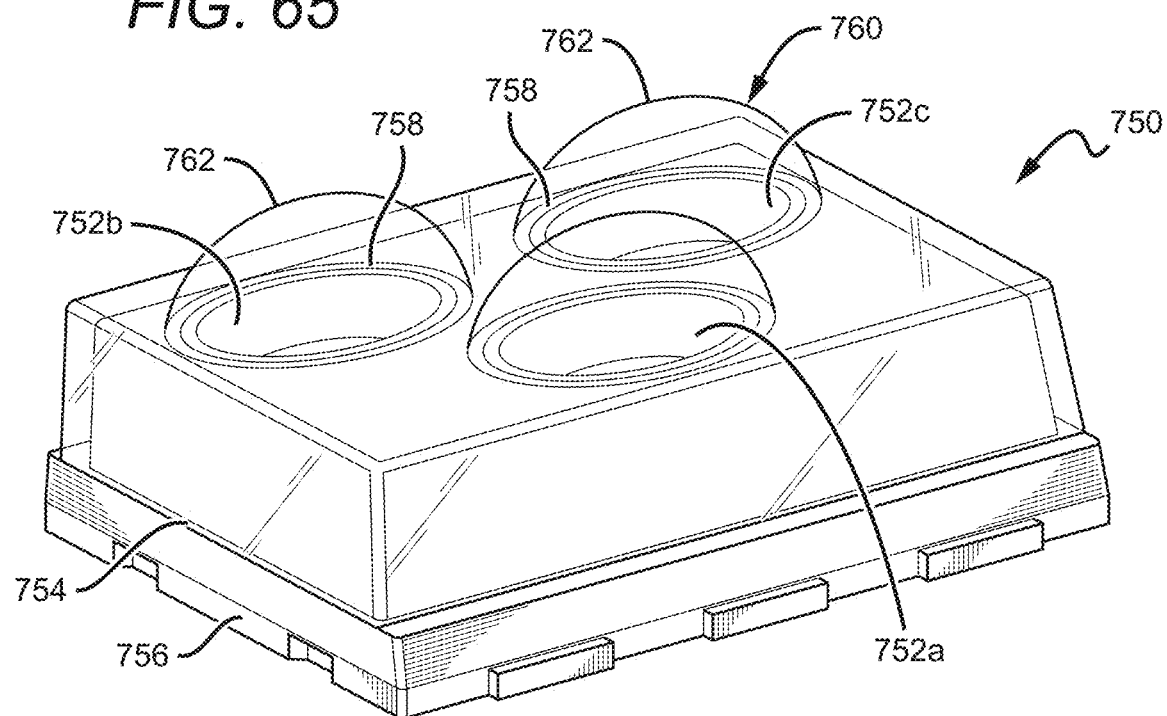
FIG. 65 is a perspective view of the LED package shown in FIG. 62.

FIGS. 59-61 show another embodiment of an LED package 730 according to the present invention having a combination of features described above to provide further improved anchoring of the encapsulant and to provide multiple barriers to moisture intrusion. The LED package comprises notches 738a-c similar to the 598a-c shown in FIG. 48 and described above. The LED package 730 also comprising moats 740 around each of the cavities 732a-c and each moat 740 similar to the moat 700 shown in FIGS. 54 to 56 and described above. As mentioned above, the notches 738a-c can have secondary features to further enhance anchoring, with notches having circular cutouts 742 at the base of each widened section 744. This is only one of many different secondary features that can be included in the different embodiments according to the present invention.

As described above, the LED packages according to the present invention can comprise an encapsulant that in different embodiments can cover different portions the package body. In some embodiments, the encapsulant can fill the cavities and can form lenses over the cavities. In other embodiments, the encapsulant can extend beyond the cavities in a continuous or partial continuous fashion to cover surfaces of the package body and cooperate with anchoring features as described above. The encapsulant not only impacts the emission pattern of the LED package with different lenses shapes and features, but can also provide for protection of the LEDs and reliable operation by minimizing moisture intrusion.

FIGS. 62 to 65 show one embodiment of an LED package 750 according to the present invention comprising cavities 752a-c in its body 756, with a step 754 around the side surfaces of the body 756. The cavities 752a-c each having a respective one of three emitters (LEDs) 753a-c that emits light out from its one of the cavities 752a-c, and each of the cavities 752a-c has moat 758 similar to those described above. In this embodiment, an encapsulant 760 is included over the body 756 that can provide protection to the different features of the LED package 750 and can also be used to form features that form or direct the light in different ways, such as by forming lenses over the emitters 753a-c. In this embodiment, the encapsulant 760 fills the cavities 752a-c and each moat 758 with the encapsulant portion in the moat 398 helping to anchor the encapsulant 760 to the body 756 and reduce moisture intrusion into the cavities 752a-c.

In different embodiments, the encapsulant can cover different body surfaces or portions of body surfaces, with the LED package 750 having an encapsulant 760 that covers all body surfaces above the step 754. Lenses 762 can be formed over the cavities 752a-c and emitters 753a-c and can be shaped to provide the desired package emission profile. As described above, the lenses used in the different embodiments described herein can comprise many different materials, such as an epoxy, and can comprise many different refractive indexes such as 1.51. In some embodiments, the epoxy can transmit approximately 100% of light emitted from the emitters, while in other embodiments it can transmit less than 100%. In still other embodiments, the epoxy can comprise a conversion material or scattering material throughout or in different locations in the encapsulant.

The encapsulant 760 can be formed over the body using different known molding processes and in some embodiments one or more of the lenses be further processed to enhance light extraction. For example, one or more of the lenses 762 can be further processed to include texturing on the surface to scatter the light or enhance light extraction. As described above, the lenses can help shape the emission of the package to provide wide angle or wide pitch emission along an axis or centerline of the LED package compared to an LED package with circular cavity and hemispheric lens. It is understood that other embodiments can have different shaped lenses and the LED packages can have lenses of different sizes. The LED packages can also comprise additional anchoring features including the notches described above.

Figure 66:
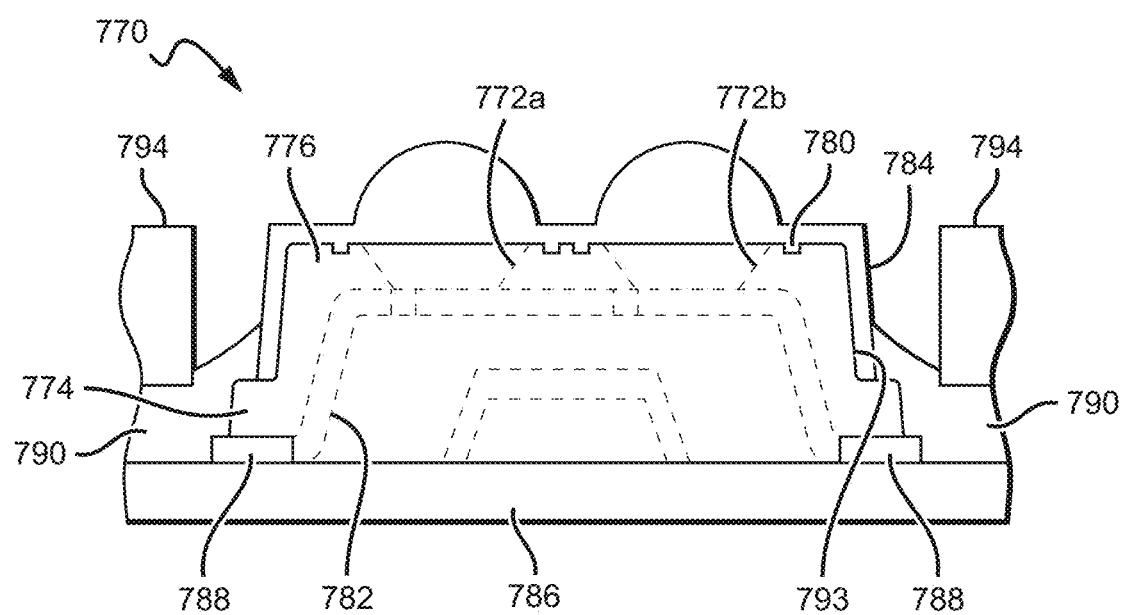
FIG. 66 is a sectional view of one embodiment of an LED display according to the present invention.

The LED packages described herein can be used in many different lighting applications, but are particularly applicable to use in LED displays. FIG. 66 shows one embodiment of an LED package 770 according to the present invention arranged as part of an LED display. Only one LED package 770 is shown, but it is understood that different displays can comprise hundreds or thousands of LED packages arranged adjacent to one another with each of the LED packages being individually controllable to emit a particular color of light. The LED display then emits an image that is generated from using the emission of the LED packages.

The LED package 770 comprises a body 776 with a step 774, cavities 772a-c (third cavity 772c not shown) and a moat 780, all as described above. The LED package 770 further comprises a lead frame 782 and an encapsulant 784, also as described above. The LED package 770 is mounted to LED display printed circuit board (PCB) 786 using known methods, and the PCB 786 that is large enough to accommodate many LED packages depending on the size and desired resolution of the display. The leads (or pins) 788 lay flat against the surface of the PCB 786 to provide for reliable contacting of the LED package 770 to the PCB 786.

A potting material 790 can be included between adjacent ones of the LED package 770 in the LED display. The potting material 790 can be arranged in different ways, with the embodiment shown having sufficient potting material 790 to cover the PCB 786 between adjacent LED packages 770 and a thickness to cover a portion of the LED package side surfaces 793, including the leads 788. In the embodiment shown, the potting material 790 has a thickness to cover the LED side surfaces to point above the step 774. This results in the leads 788 and transition point between the step 774 and the encapsulant 784 being covered by the potting material 790. This helps prevent moisture from reaching this transition point which helps reduce the moisture intrusion into the LED package 770. The potting material 790 can be made of many different materials, with some embodiments comprising a silicone based material that is particularly applicable to outdoor applications. In LED displays used for outdoor daytime applications, louvers 794 can be included between at least some of the LED packages to reduce or prevent sunlight reflection off the LED packages 770. The louvers 794 can also be made of silicone based materials, but it is understood that other materials can also be used.

Figure 67:
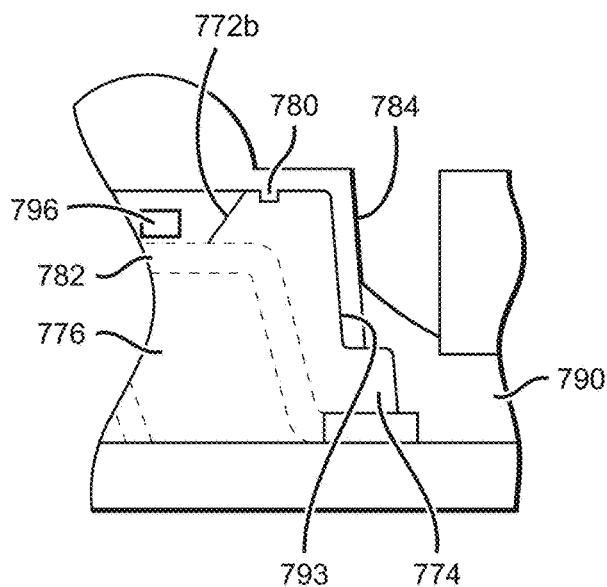
FIG. 67 is another sectional view of the LED display shown in FIG. 66.

As described above, the LED packages are arranged to minimize or prevent moisture intrusion in the package cavities to prevent failure of the LED packages. This results in more reliable LED display operation and longer display lifespan. Referring now to FIG. 67 for moisture to reach the cavity 772*b*, it must penetrate the transition between the potting material 790 and the encapsulant 784, then pass to the transition between the step 774 and the encapsulant 784. The moisture must then penetrate this transition and run up the side of the body 776 and the top surface of the body 776, to the moat 780. The moisture must then pass the transitions provided by the moat 780 and encapsulant 784 and spread past the moat 780, down the surface of the cavity 772*b*, to the lead frame 782 and emitter 796. This number of transitions and length of the path for the moisture helps reduce or eliminate the amount of moisture that would actually make it to the lead frame 782 or emitter 796, thereby increasing reliability of the LED package 770. The reliability can be further enhanced by including other anchoring features as described above.

Figure 68:
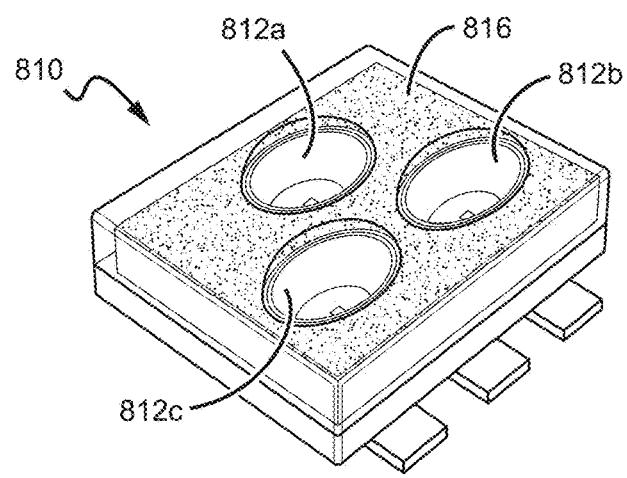
FIG. 68 is a perspective view of another embodiment of an LED package according to the present invention.
Figure 69:
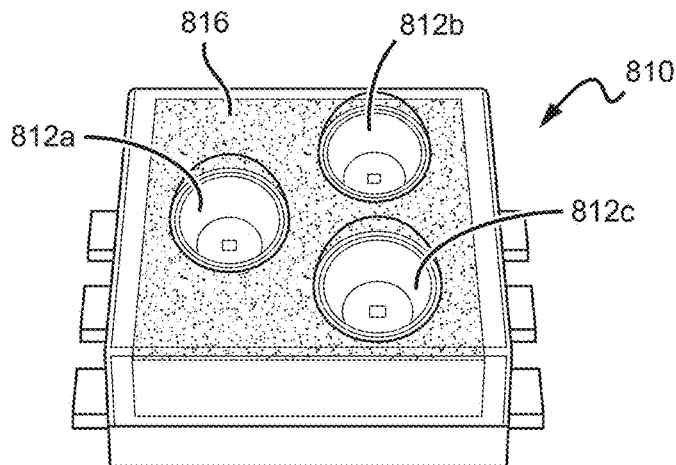
FIG. 69 is another perspective view of the LED package shown in FIG. 68.

FIGS. 68 and 69 show another embodiment of an LED package 810 according to the present invention have cavities 812*a-c* in its body 816 as described above. In this embodiment, the surface of the body is black which can provide improved image contrast in some applications. In some embodiments, the surface of the body is made black by stencil printing a black ink on the surface. In some applications, there is a danger that some of the ink can spread to the cup where it may interfere with emission of the LED(s) in the cup. The notch and moat anchoring features described above can provide the additional advantage of blocking the spread of the black ink to prevent its spread to the cavities. This further enhances the lifetime operation of these LED packages.

The LED packages according to the present invention can be used in many different lighting applications beyond LED displays. Some of these include, but are not limited to, street lights, architectural lights, home and office lighting, display lighting and backlighting.

Although the present invention has been described in detail with reference to certain preferred configurations thereof, other versions are possible. Therefore, the spirit and scope of the invention should not be limited to the versions described above.

We claim:

1. A light emitting diode (LED) package, comprising:
   a body having body side surfaces and a body top surface that is the topmost surface of said body;
   a plurality of cavities in said top surface, with each of said cavities having an LED arranged to emit out of its one of said cavities, wherein said body side surfaces face away from said cavities;
   an encapsulant over said body top surface and said body side surfaces, said encapsulant also comprising lenses over each of said cavities to shape the emission of said LEDs to the desired emission profile, wherein the intensity of each of said LEDs is individually controllable, said LED package emitting different color combinations of light from said LEDs.

2. The LED package of claim 1, further comprising a step in at least two side surfaces of the body.

3. The LED package of claim 2, wherein said encapsulant covers the body side surfaces and body top surface above said step.

4. The LED package of claim 1, wherein said body further comprises anchoring features.

5. The LED package of claim 4, wherein said anchoring features comprise one or more fingers or notches in said housing top surface.

6. The LED package of claim 4, wherein said anchoring features comprise a moat around at least one of said cavities.

7. The LED package of claim 4, wherein said lenses generate a package emission profile that having a wider angle compared to an LED package without said lenses.

8. A light emitting diode (LED) display, comprising:
   a plurality of LED packages, at least some comprising a body with a plurality of cavities, with each of said cavities having an LED arranged to emit out of its one of said cavities and an encapsulant comprising lenses over said cavities wherein said encapsulant continues from said lenses down the side surfaces of said body; and
   a potting material between adjacent ones of said LED packages, said potting material having a thickness such that it overlaps said encapsulant on said body side surfaces.

9. The LED display of claim 8, wherein the top of said potting material at said body side surfaces is higher than the lower edge of said encapsulant at said side surfaces.

10. The LED display of claim 8, wherein said body side surfaces comprise a step, wherein said encapsulant continues down said body side surfaces to said step.

11. The LED display of claim 8, wherein said potting material covers the transition surfaces between said encapsulant and said step.

12. The LED display of claim 8, further comprising louvers between adjacent ones of said LED packages.

13. The LED display of claim 8, further comprising anchoring features in the surface of said body.

14. A light emitting diode (LED) package, comprising:
   a body having side surfaces and a top surface;
   a plurality of cavities in said top surface, with each of said cavities having a plurality of LEDs arranged to emit out of their one of said cavities, wherein each of said LEDs is individually controllable;
   at least one anchoring features in the surface of said body,
   an encapsulant over said body top surface and said body side surfaces, said encapsulant cooperating with said anchoring features to anchor said encapsulant to said body.

15. The LED package of claim 14, wherein said encapsulant also comprising one or more lenses over each of said cavities.

16. The LED package of claim 14, further comprising a step in in at least two side surfaces of the body, wherein said encapsulant covers the body side surfaces and body top surface above said step.

17. The LED package of claim 14, wherein said anchoring features comprise one or more notches or moats.

18. The LED package of claim 14, further comprising a lead frame with leads that form a lead frame plateau, wherein the leads cover more than 70% of the area of said plateau.

19. The LED package of claim 18, wherein said leads in said lead frame plateau comprise one or more widened portions.

20. A light emitting diode (LED) package, comprising:
   a body having side surfaces and a top surface;

a plurality of cavities in said top surface, with each of said cavities having an LED arranged to emit out of its one of said cavities;

at least one anchoring features in the surface of said body, an encapsulant over said body top surface and said body side surfaces, said encapsulant cooperating with said anchoring features to anchor said encapsulant to said body, wherein said encapsulant fill said anchoring features to anchor said encapsulant to said body.

* * * * *